(12) United States Patent
Zhang et al.

(10) Patent No.: US 12,347,810 B2
(45) Date of Patent: Jul. 1, 2025

(54) SEMICONDUCTOR DEVICE PACKAGE DIE STACKING SYSTEM AND METHOD

(71) Applicant: Western Digital Technologies, Inc., San Jose, CA (US)

(72) Inventors: Yazhou Zhang, Shanghai (CN); Jiandi Du, Shanghai (CN); Hope Chiu, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 328 days.

(21) Appl. No.: 17/369,307

(22) Filed: Jul. 7, 2021

(65) Prior Publication Data

US 2023/0011439 A1   Jan. 12, 2023

(51) Int. Cl.
| | | |
|---|---|---|
| *H01L 25/065* | (2023.01) | |
| *G11C 11/06* | (2006.01) | |
| *H01L 23/31* | (2006.01) | |
| *H01L 23/538* | (2006.01) | |
| *H01L 25/00* | (2006.01) | |

(Continued)

(52) U.S. Cl.
CPC .......... *H01L 25/0657* (2013.01); *G11C 11/06* (2013.01); *H01L 23/31* (2013.01); *H01L 23/5386* (2013.01); *H01L 25/105* (2013.01); *H01L 25/50* (2013.01); *H10B 41/27* (2023.02); *H01L 24/48* (2013.01); *H01L 25/18* (2013.01); *H01L 2224/48147* (2013.01); *H01L 2225/06506* (2013.01); *H01L 2225/06548* (2013.01); *H01L 2225/06562* (2013.01); *H01L 2225/1041* (2013.01); *H01L 2225/1052* (2013.01); *H10B 80/00* (2023.02)

(58) Field of Classification Search
CPC ... H01L 25/0657; H01L 25/105; H01L 25/18; H01L 2225/06506; H01L 2225/06548; H01L 2225/06562; H01L 2225/10–1094; H01L 2224/48145–48179
See application file for complete search history.

(56) References Cited

U.S. PATENT DOCUMENTS

2012/0153471 A1 * 6/2012 Watanabe ........... H01L 23/3128
                                                            257/E23.021
2013/0228867 A1 * 9/2013 Suematsu ............... H01L 23/60
                                                            257/355

(Continued)

FOREIGN PATENT DOCUMENTS

WO   WO-2019212623 A1 * 11/2019 ....... H01L 21/76897

*Primary Examiner* — Yu Chen
(74) *Attorney, Agent, or Firm* — Morgan, Lewis & Bockius LLP

(57) ABSTRACT

A semiconductor memory device includes first memory dies stacked one upon another and electrically connected one to another by first bond wires, and covered with a first encapsulant. Second memory dies are disposed above the first memory dies, stacked one upon another and electrically connected one to another with second bond wires, and covered with a second encapsulant. A control die may be mounted on the top die in the second die stack. Vertical bond wires extend between the stacked die modules. A redistribution layer is formed over the top die stack and the control die to allow for electrical communication with the memory device. The memory device allows for stacking memory dies in a manner that allows for increased memory capacity without increasing the package form factor.

13 Claims, 15 Drawing Sheets

(51) Int. Cl.
    *H01L 25/10*     (2006.01)
    *H10B 41/27*     (2023.01)
    *H01L 23/00*     (2006.01)
    *H01L 25/18*     (2023.01)
    *H10B 80/00*     (2023.01)

(56) References Cited

U.S. PATENT DOCUMENTS

| | | | |
|---|---|---|---|
| 2014/0183727 A1* | 7/2014 | Lu | H01L 25/50 257/769 |
| 2014/0339290 A1* | 11/2014 | Han | H01L 24/49 228/180.5 |
| 2017/0309597 A1* | 10/2017 | Chuang | H01L 24/97 |
| 2018/0026022 A1* | 1/2018 | Lee | H01L 23/5386 257/659 |
| 2018/0211943 A1* | 7/2018 | Song | H01L 23/13 |
| 2018/0366441 A1* | 12/2018 | Lai | H01L 25/0657 |
| 2020/0251447 A1* | 8/2020 | Kang | H01L 23/481 |
| 2022/0052015 A1* | 2/2022 | Hasegawa | H01L 24/13 |
| 2022/0199580 A1* | 6/2022 | Homma | H01L 25/0657 |
| 2022/0285320 A1* | 9/2022 | Sano | H01L 24/05 |
| 2022/0375901 A1* | 11/2022 | Yamamoto | H01L 25/50 |
| 2022/0392866 A1* | 12/2022 | Park | H01L 24/20 |

* cited by examiner

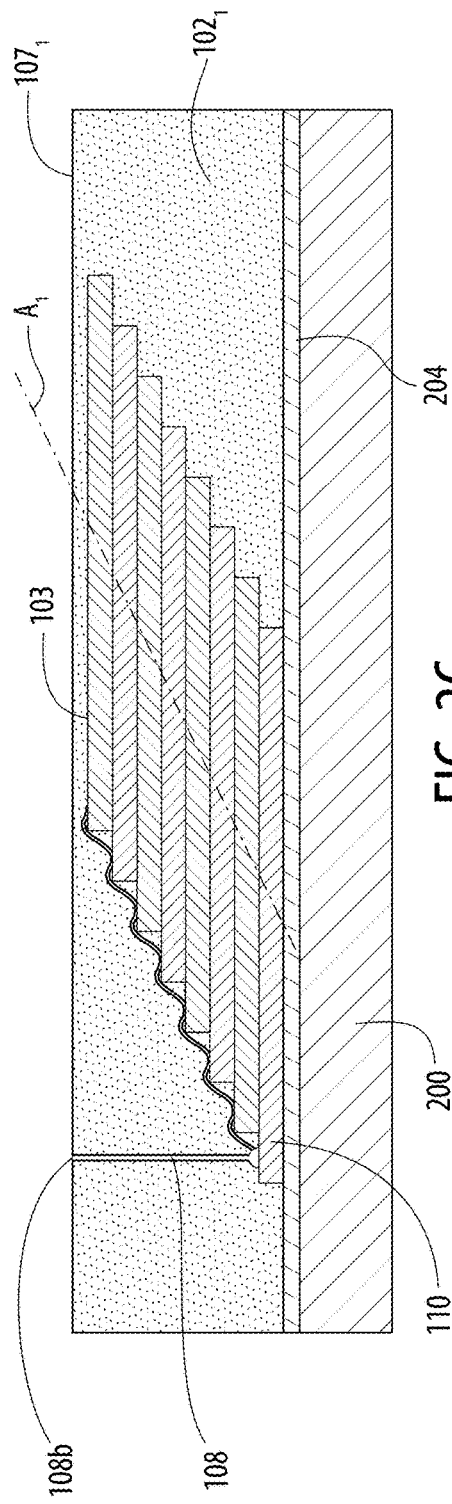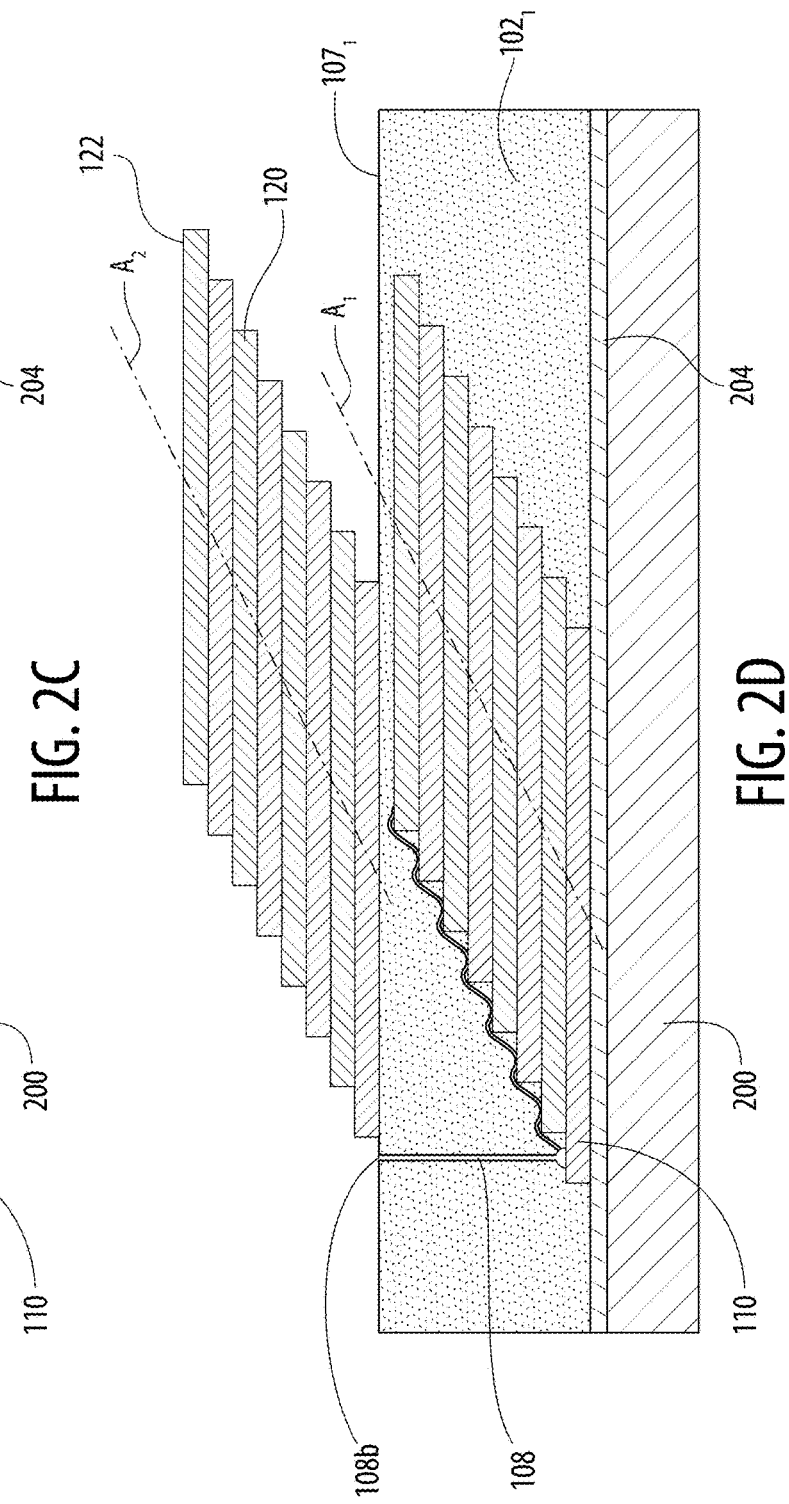

SEMICONDUCTOR DEVICE PACKAGE DIE STACKING SYSTEM AND METHOD

BACKGROUND

The present disclosure generally relates to packaging for semiconductor memory devices (e.g., NAND flash devices) and manufacture thereof and, more particularly, to a package having stacked semiconductor dies and methods of manufacturing thereof.

Packaging for integrated circuits (IC) and/or other semiconductor devices that include a plurality of dies (e.g., NAND dies) often requires that the packaging be sized to enclose each of said dies. As the size of the dies increases and/or as the number of dies increases, the size of the packaging must increase as well. However, package size is often limited to industry standard sizes and therefore, as the size and/or number of the dies increases, it becomes difficult to enclose the same number of dies in a single package. Additionally, the dies may be stacked and interconnected to one another within the packaging. The stacked dies may form a generally staircase like structure where the top die is offset from the bottom die in order to improve electrical performance. As the size of the dies increases in one or more directions (e.g., height, length), the corresponding size of the package must increase as well. For instance, as the length of the dies increases, the overall length of the package must increase as well to accommodate the size of the die. In the instance of stacked dies, this increase in the length of the die causes the overall length of the package to increase significantly more than the length of the die due to the staircase-like stacking structure.

Therefore, there is a need to provide a stacking structure that allows for the same number of dies to be enclosed within a semiconductor device package without increasing the size of the semiconductor device package.

SUMMARY

In one embodiment there is a semiconductor device package including a first plurality of semiconductor dies stacked one upon another, a first die bond wire electrically connecting each die of the first plurality of semiconductor dies one to another, and a first vertical bond wire configured to electrically couple the first plurality of semiconductor dies to a control die. The semiconductor device package includes a first encapsulant at least partially encapsulating the first plurality of semiconductor dies, the first die bond wire, and the first vertical bond wire, and a second plurality of semiconductor dies positioned at a top planar surface of the first encapsulant, each die of the second plurality of semiconductor dies stacked one upon another. The semiconductor device package includes a second die bond wire electrically connecting each die of the second plurality of semiconductor dies one to another, a second vertical bond wire configured to electrically couple the second plurality of semiconductor dies to the control die, and a second encapsulant at least partially encapsulating the second plurality of semiconductor dies, the second die bond wire, and the second vertical bond wire.

In some embodiments, the semiconductor device package further includes a first extension to the first vertical bond wire electrically connected to an end of the first vertical bond wire and extending upwardly from the top planar surface of the first encapsulant, the second encapsulant at least partially encapsulates the first extension to the first vertical bond wire. In some embodiments, the first vertical bond wire and the first extension to the first vertical bond wire are substantially parallel to the second vertical bond wire. In some embodiments, the semiconductor device package further includes a redistribution layer configured to electrically couple a control die to the first and second pluralities of semiconductor dies, the first vertical bond wire and the second vertical bond wire are electrically connected to the redistribution layer.

In some embodiments, the semiconductor device package further includes the control die and the control die is disposed between the redistribution layer and the second plurality of semiconductor dies. In some embodiments, a layer of the first encapsulant is positioned between a bottom surface of the second plurality of semiconductor dies and a top surface of the first plurality of semiconductor dies. In some embodiments, the first plurality of semiconductor dies are positioned along a first axis and the second plurality of semiconductor dies are positioned along a second axis, wherein the second axis is generally parallel to and spaced from the first axis and the first axis and the second axis are at an oblique angle relative to an axis extending along a bottom surface of the first plurality of semiconductor dies.

In another embodiment there is a method of stacking two or more pluralities of semiconductor dies including providing a substrate having a top surface and a bottom surface, and positioning a first plurality of semiconductor dies on the top surface of the substrate, each semiconductor die of the first plurality of semiconductor dies mounted one upon another to form a first die stack. The method includes electrically connecting the semiconductor dies of the first die stack one to another with a first die bond wire, and forming a first vertical bond wire in electrical communication with the first plurality of semiconductor dies, the first vertical bond wire having a first end coupled to the first die bond wire and a second end disposed opposite the first end. The method includes encapsulating the first plurality of semiconductor dies, the first die bond wire and the first vertical bond wire with a first encapsulant, wherein the second end of the first vertical bond wire is exposed at a top planar surface of the first encapsulant, and positioning a second plurality of semiconductor dies on the top planar surface of the first encapsulant, each semiconductor die of the second plurality of semiconductor dies mounted one upon another to form a second die stack. The method includes electrically connecting semiconductor dies of the second plurality of semiconductor dies one to another with second die bond wires, and forming a second vertical bond wire in electrical communication with the second plurality of semiconductor dies, the second vertical bond wire having a first end coupled to the second die bond wire and a second end disposed opposite the first end. The method includes forming a first extension to the first vertical bond wire, the first extension to the first vertical bond wire having a first end connected to the second end of the first vertical bond wire and a second end disposed opposite the first end of the first extension to the first vertical bond wire, and encapsulating the second plurality of semiconductor dies, the second vertical bond wire, the second die bond wires, and the first extension to the first vertical bond wire with a second encapsulant, wherein the second end of the second vertical bond wire and the second end of the first extension to the first vertical bond wire are exposed at a top planar surface of the second encapsulant.

In some embodiments, the first vertical bond wire and the first extension to the first vertical bond wire are substantially parallel to the second vertical bond wire. In some embodiments, the method further includes positioning a redistribution layer above the second plurality of semiconductor dies, the redistribution layer configured to electrically couple a control die to the first and second pluralities of semiconductor dies, and electrically connecting the first vertical bond wire and the second vertical bond wire to the redistribution layer. In some embodiments, the method further includes positioning the control die between the redistribution layer and the second plurality of semiconductor dies, and electrically connecting the control die to the redistribution layer.

In some embodiments, the method further includes positioning a plurality of solder balls on a top planar surface of the redistribution layer, the plurality of solder balls in electrical communication with the redistribution layer. In some embodiments, a layer of the first encapsulant is positioned between a bottom surface of the second plurality of semiconductor dies and a top surface of the first plurality of semiconductor dies. In some embodiments, the first plurality of semiconductor dies are positioned along a first axis and the second plurality of semiconductor dies are positioned along a second axis, wherein the second axis is generally parallel to and spaced from the first axis and the first axis and the second axis are at an oblique angle relative to an axis extending along a bottom surface of the first plurality of semiconductor dies.

In another embodiment, there is a semiconductor device package including a control die, a first plurality of semiconductor dies stacked one upon another, a first die bond wire electrically connecting each die of the first plurality of semiconductor dies one to another, and a first vertical bond wire configured to electrically couple the first plurality of semiconductor dies to the control die. The semiconductor device package includes a first encapsulant at least partially encapsulating the first plurality of semiconductor dies, the first die bond wire, and the first vertical bond wire, and a second plurality of semiconductor dies positioned at a top planar surface of the first encapsulant, each die of the second plurality of semiconductor dies stacked one upon another. The semiconductor device package includes a second die bond wire electrically connecting each die of the second plurality of semiconductor dies one to another, a second vertical bond wire configured to electrically couple the second plurality of semiconductor dies to the control die, and a first extension to the first vertical bond wire electrically connected to an end of the first vertical bond wire and extending upwardly from the top planar surface of the first encapsulant. The semiconductor device package includes a second encapsulant at least partially encapsulating the second plurality of semiconductor dies, the second die bond wire, the first extension to the first vertical bond wire and the second vertical bond wire, and a redistribution layer configured to electrically couple the control die to the first and second pluralities of semiconductor dies. The first vertical bond wire and the second vertical bond wire are electrically connected to the redistribution layer.

In some embodiments, the first vertical bond wire and the first extension to the first vertical bond wire are substantially parallel to the second vertical bond wire. In some embodiments, the control die is electrically connected to the redistribution layer. In some embodiments, the control die is disposed between the redistribution layer and the second plurality of semiconductor dies. In some embodiments, a layer of the first encapsulant is positioned between a bottom surface of the second plurality of semiconductor dies and a top surface of the first plurality of semiconductor dies. In some embodiments, the first plurality of semiconductor dies are positioned along a first axis and the second plurality of semiconductor dies are positioned along a second axis, wherein the second axis is generally parallel to and spaced from the first axis and the first axis and the second axis are at an oblique angle relative to an axis extending along a bottom surface of the first plurality of semiconductor dies.

BRIEF DESCRIPTION OF THE DRAWINGS

The foregoing summary, as well as the following detailed description, will be better understood when read in conjunction with the appended drawings. For the purpose of illustrating the present disclosure, there are shown in the drawings embodiments which are presently preferred, wherein like reference numerals indicate like elements throughout. It should be noted, however, that aspects of the present disclosure can be embodied in different forms and thus should not be construed as being limited to the illustrated embodiments set forth herein. The elements illustrated in the accompanying drawings are not necessarily drawn to scale, but rather, may have been exaggerated to highlight the important features of the subject matter therein. Furthermore, the drawings may have been simplified by omitting elements that are not necessarily needed for the understanding of the disclosed embodiments.

In the drawings:

FIGS. 2A-2K are cross-sectional side views of illustrating the assembly of the semiconductor device package of FIG. 1A in accordance with an embodiment of the present disclosure.

DETAILED DESCRIPTION

The present subject matter will now be described more fully hereinafter with reference to the accompanying Figures, in which representative embodiments are shown. The present subject matter can, however, be embodied in different forms and should not be construed as limited to the embodiments set forth herein. Rather, these embodiments are provided to describe and enable one of skill in the art.

Referring to FIGS. 1A-1D there is shown a semiconductor device package having two or more pluralities of semiconductor dies stacked one on top of the other and a method for producing such a semiconductor device package. In some embodiments, the two or more pluralities of semiconductor dies are stacked such that each of the pluralities of semiconductor dies positioned along respective axes that are spaced from one another.

Figure 1A:
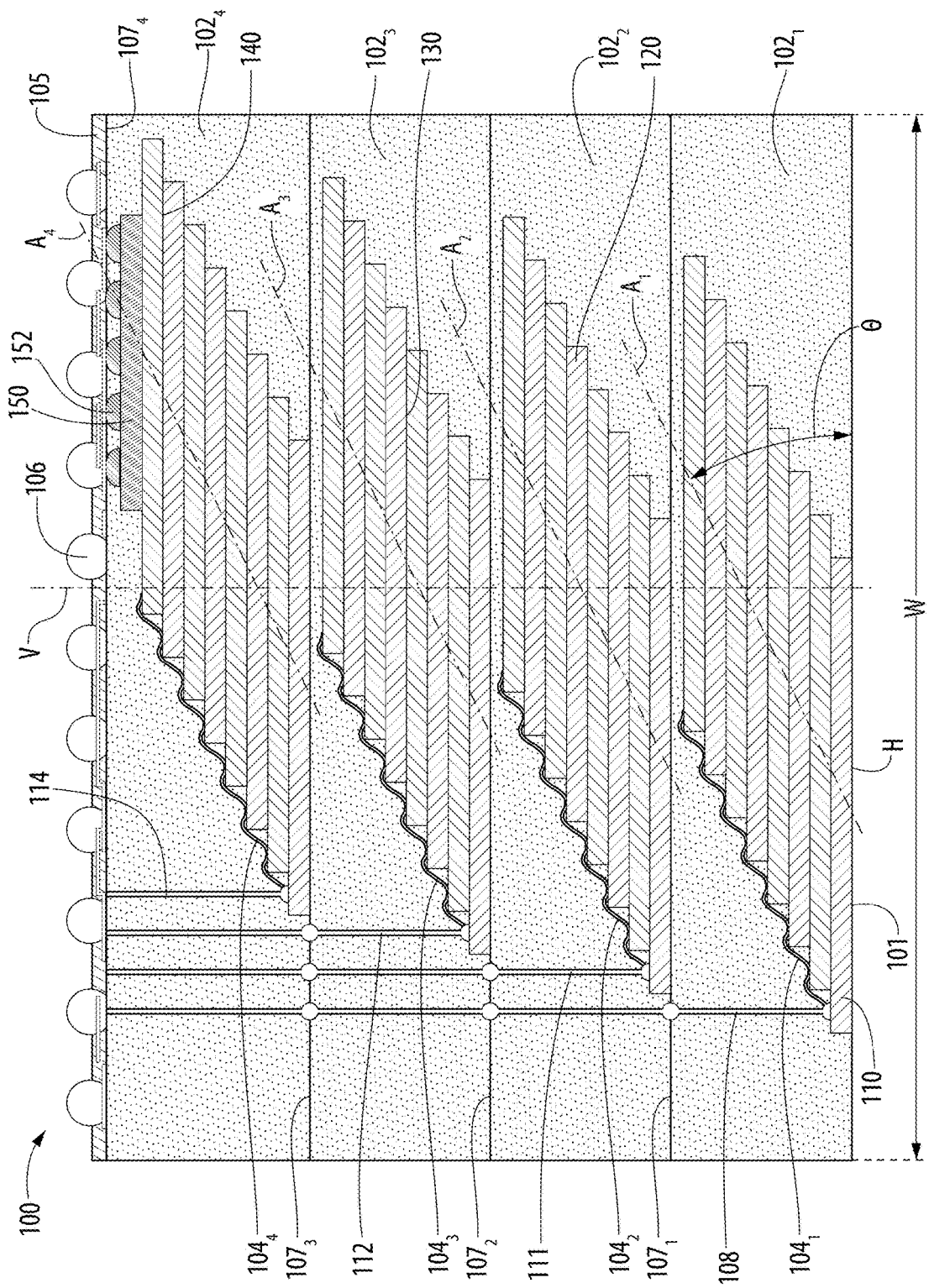
FIG. 1A is a cross-sectional side view of a portion of a semiconductor device package having four sets of stacked semiconductor dies in accordance with an embodiment of the present disclosure.

Referring to FIG. 1A there is shown a semiconductor device package, generally designated 100, in accordance with an exemplary embodiment of the present disclosure. The semiconductor device package 100 may include a first plurality of semiconductor dies 110, e.g., a plurality of NAND dies or other memory chips, for providing a first combined storage amount. In some embodiments, the semiconductor dies included in the first plurality of semiconductor dies 110 are stacked on top of one another. In some embodiments, the semiconductor dies included in the first plurality of semiconductor dies 110 each have a similar physical size and shape. In some embodiments, the semiconductor dies are stacked in a generally staircase-like structure or pattern. In the example shown in FIG. 1A, each semiconductor die in the first plurality of semiconductor dies 110 is positioned above and offset (e.g., to the right) of the semiconductor die directly below it. In some such embodiments, a semiconductor die may be partially, but not entirely, overlaid by an adjacent semiconductor die. The portion of the semiconductor die that is not overlaid may provide space for electrical connections (e.g., bond wires). In some embodiments, each semiconductor die included in the first plurality of semiconductor dies 110 may be positioned along a first axis $A_1$. For example, in the embodiment shown in FIG. 1, the first plurality of semiconductor dies 110 includes eight semiconductor dies stacked on top of one another in a staircase-like pattern, where each semiconductor die is offset from an adjacent semiconductor die and such that each semiconductor die is generally positioned along the first axis $A_1$. In some embodiments, first axis $A_1$ passes through the center of the first (e.g., bottom) and last (e.g., top) semiconductor die of the first plurality of semiconductor dies 110. The first axis $A_1$ may be at an oblique angle θ (e.g., an acute angle) relative to an axis H that is parallel to a bottom surface 101 of the first plurality of semiconductor dies 110.

Figure 1B:
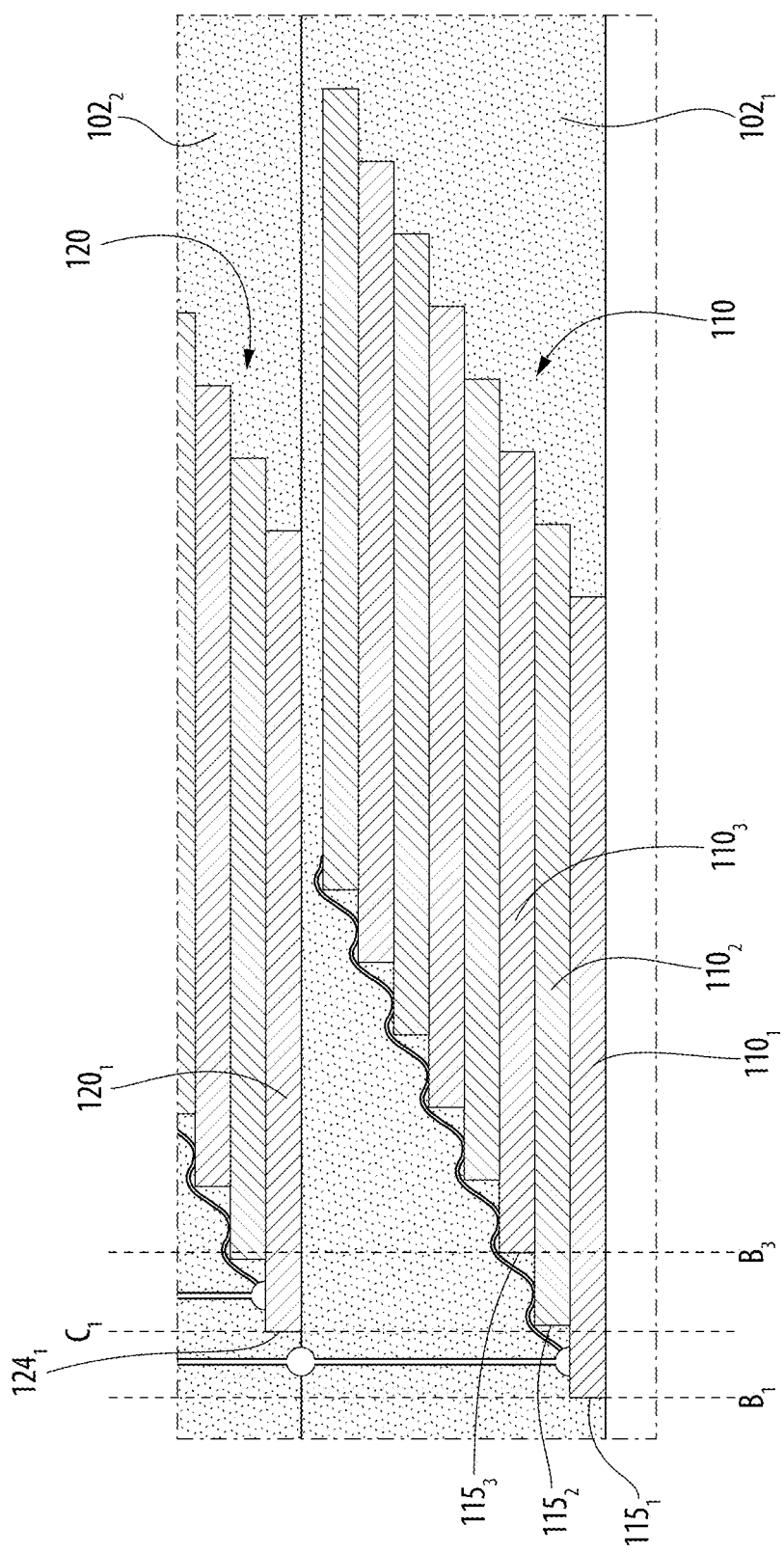
FIGS. 1B-1D are enhanced views of select portions of the semiconductor device package of FIG. 1A.

The semiconductor device package 100 may include a second plurality of semiconductor dies 120 for providing a second combined storage amount. For example, the second plurality of semiconductor dies may include a plurality of NAND dies each having an associated storage capacity. In some embodiments, the second plurality of semiconductor dies 120 may be disposed above the first plurality of semiconductor dies 110. In some embodiments, the second plurality of semiconductor dies 120 may be disposed above and, in some embodiments, offset from the first plurality of semiconductor dies 110. Referring to FIG. 1B, in some embodiments, a proximal edge of at least one semiconductor die of the second plurality of semiconductor dies 120 may be positioned along an axis generally parallel to and positioned between axes corresponding to the position of the proximal edges of at least two semiconductor dies of the first plurality of semiconductor dies 110. For example, a proximal edge 124$_1$ of the first semiconductor die 120$_1$ (e.g., the bottom semiconductor die) of the second plurality of semiconductor dies 120 may be positioned between a proximal edge 115$_1$ of the first semiconductor die 110$_1$ and a proximal edge 115$_3$ of the third semiconductor die 110$_3$ of the first plurality of semiconductor dies 110. For example, proximal edge 124$_1$ may extend along an axis $C_1$ generally parallel to and positioned between axes $B_1$ and $B_3$ that proximal edges 115$_1$ and 115$_3$ extend along respectively. In some embodiments, a proximal edge 115$_2$ of the second semiconductor die 110$_2$ of the first plurality of semiconductor dies 110 may extend along axis $C_1$. In other embodiments, proximal edge 115$_2$ may be proximate axis $C_1$.

Referring back to FIG. 1A, in some embodiments, the semiconductor dies included in the second plurality of semiconductor dies 120 are stacked on top of one another similar to the semiconductor dies of the first plurality of semiconductor dies 110. For example, the semiconductor dies of the second plurality of semiconductor dies may be stacked on top of one another in a staircase-like pattern. In some embodiments, the second plurality of semiconductor dies positioned along a second axis $A_2$. In some embodiments, second axis $A_2$ passes through the center of the first (e.g., bottom) and last (e.g., top) semiconductor dies of the second plurality of semiconductor dies 120. In some embodiments, the second axis $A_2$ is generally parallel to the first axis $A_1$ of the first plurality of semiconductor dies 110. In some embodiments, the second axis $A_2$ does not intersect with the first axis $A_1$ of the first plurality of semiconductor dies 110. In some embodiments, the second axis $A_2$ is spaced from the first axis $A_1$. For example, the second axis $A_2$ may be disposed above the first axis $A_1$ such that the second plurality of semiconductor dies 120 are disposed above the first plurality of semiconductor dies 110. In some embodiments, first axis $A_1$ does not intersect with any of the semiconductor dies of the second plurality of semiconductor dies 120. By providing the second plurality of semiconductor dies 120 above the first plurality of semiconductor dies 110 and positioning the second plurality of semiconductor dies 120 along axis $A_2$, the width w of the semiconductor device package 100 may be reduced as opposed to if the second plurality of semiconductor dies 120 were disposed along axis $A_1$.

Figure 1C:
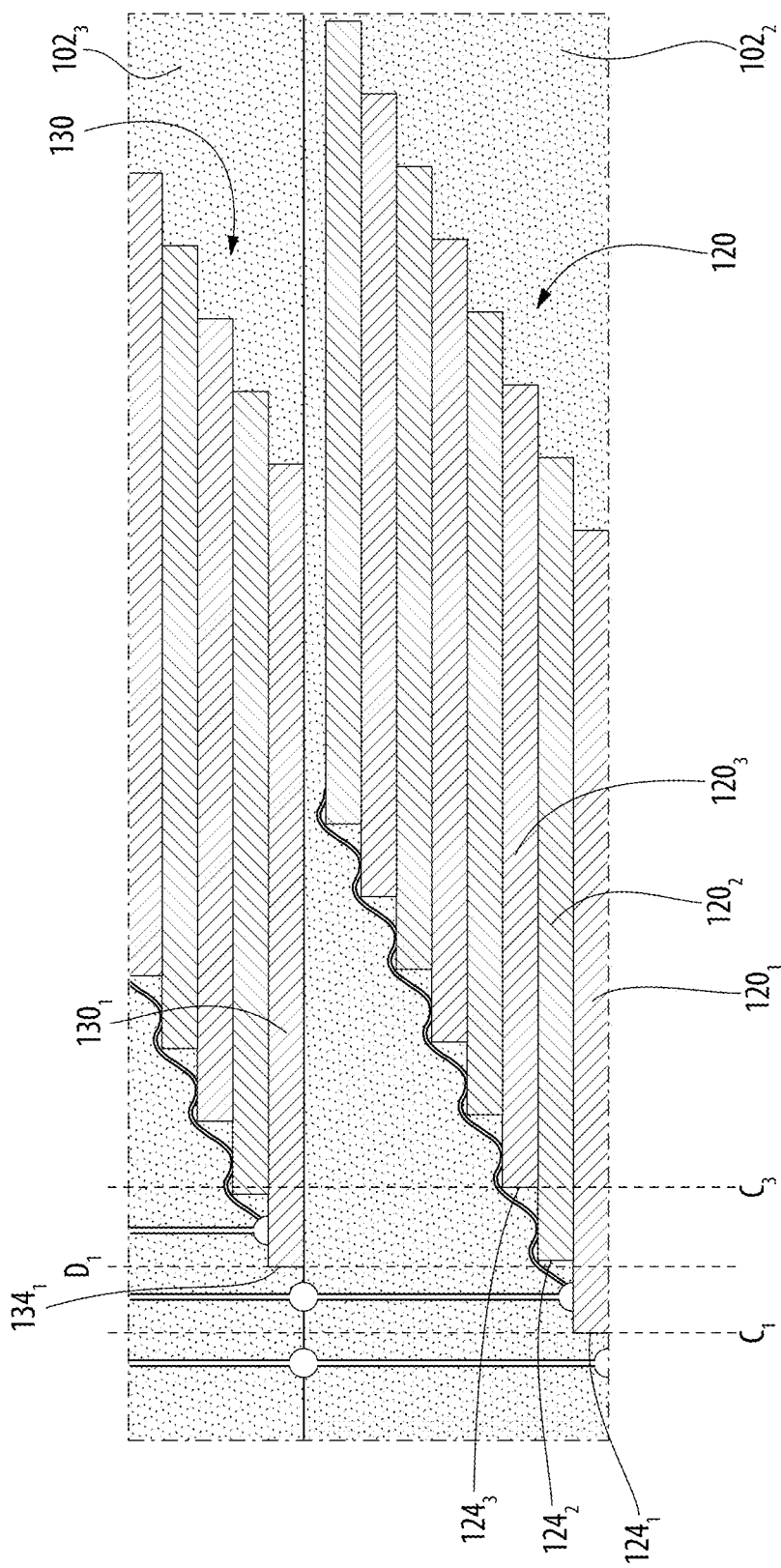

In some embodiments, the semiconductor device package 100 may include a third plurality of semiconductor dies 130 for providing a third combined storage amount. For example, the third plurality of semiconductor dies may include a plurality of NAND die each having an associated storage capacity. In some embodiments, the third plurality of semiconductor dies 130 may be disposed above the second plurality of semiconductor dies 120. In some embodiments, the third plurality of semiconductor dies 130 may be disposed above and offset from the second plurality of semiconductor dies 120. Referring to FIG. 1C, in some embodiments, a proximal edge of at least one semiconductor die of the third plurality of semiconductor dies 130 may extend along an axis generally parallel to and positioned between axes corresponding to the position of the proximal edges of at least two semiconductor dies of the second plurality of semiconductor dies 120. For example, a proximal edge 134$_1$ of the first semiconductor die 130$_1$ (e.g., the bottom semiconductor device) of the third plurality of semiconductor dies 130 may be positioned between a proximal edge 124$_1$ of the first semiconductor die 120$_1$ and a proximal edge 124$_3$ of the third semiconductor die 120$_3$ of the second plurality of semiconductor dies 120. For example, proximal edge 134$_1$ may extend along an axis $D_1$ that is generally parallel to and positioned between axes $C_1$ and $C_3$ that proximal edges 124$_1$ and 124$_3$ extend along respectively. In some embodiments, a proximal edge 124$_2$ of the second semiconductor die 120$_2$ of the second plurality of semiconductor dies 120 may extend along axis $D_1$. In other embodiments, proximal edge 124$_2$ may be proximate axis $D_1$.

Referring back to FIG. 1A, in some embodiments, the semiconductor dies included in the third plurality of semiconductor dies 130 are stacked on top of one another similar to the semiconductor dies of the first plurality of semiconductor dies 110. For example, the semiconductor dies of the third plurality of semiconductor dies 130 may be stacked on top of one another in a staircase-like pattern. In some embodiments, the third plurality of semiconductor dies 130 positioned along a third axis $A_3$. In some embodiments, third axis $A_3$ passes through the center of the first (e.g., bottom) and last (e.g., top) semiconductor dies of the third plurality of semiconductor dies 130. In some embodiments, the third axis $A_3$ is generally parallel to the first axis $A_1$ of the first plurality of semiconductor dies 110, and may also be generally parallel to the second axis $A_2$ of the second plurality of semiconductor dies 120. In some embodiments, the third axis $A_3$ is spaced from the first axis $A_1$, and the second axis $A_2$. For example, the third axis $A_3$ may be disposed above the first axis $A_1$ and the second axis $A_2$ such that the third plurality of semiconductor dies 130 are disposed above the first plurality of semiconductor dies 110 and the second plurality of semiconductor dies 120. By providing the third plurality of semiconductor dies 130 above the second plurality of semiconductor dies 120 and positioning the third plurality of semiconductor dies 130 along axis $A_3$, the width w of the semiconductor device package 100 may be reduced as opposed to if the third plurality of semiconductor dies 130 were disposed along axis $A_1$.

Figure 1D:
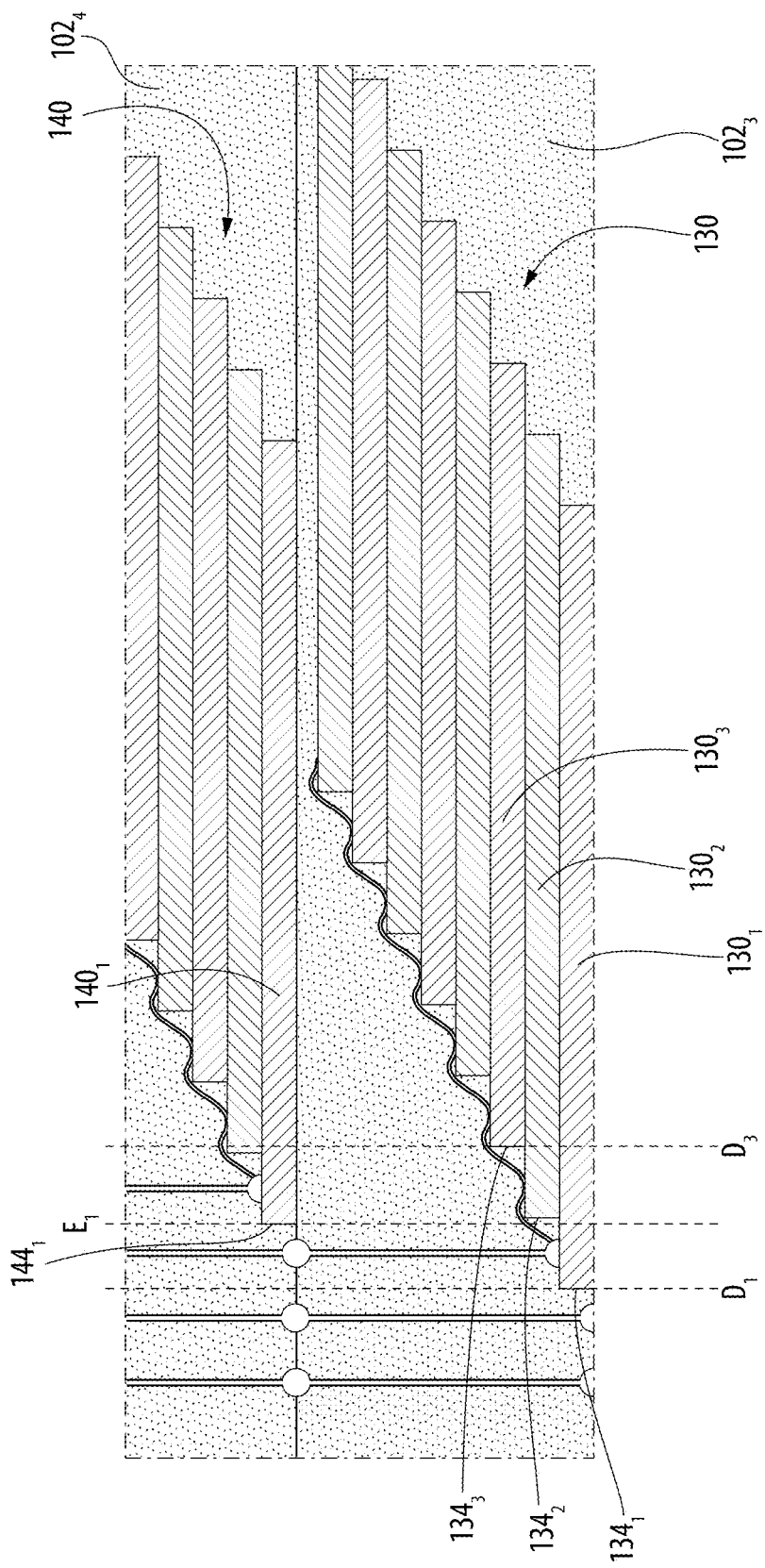

In some embodiments, the semiconductor device package 100 may include a fourth plurality of semiconductor dies 140 for providing a fourth combined storage amount. For example, the fourth plurality of semiconductor dies 140 may include a plurality of NAND die each having an associated storage capacity. In some embodiments, the fourth plurality of semiconductor dies 140 may be disposed above the third plurality of semiconductor dies 130. In some embodiments, the fourth plurality of semiconductor dies 140 may be disposed above and offset from the third plurality of semiconductor dies 130. Referring to FIG. 1D, in some embodiments, a proximal edge of at least one semiconductor die of the fourth plurality of semiconductor dies 140 may extend along an axis generally parallel to and positioned between axes corresponding to the position of the proximal edges of at least two semiconductor dies of the third plurality of semiconductor dies 130. For example, a proximal edge $144_1$ of the first semiconductor device $140_1$ (e.g., the bottom semiconductor device) of the fourth plurality of semiconductor dies 140 may be positioned between a proximal edge $134_1$ of the first semiconductor device $130_1$ and a proximal edge $134_3$ of the third semiconductor die $130_3$ of the third plurality of semiconductor dies 130. For example, proximal edge $144_1$ may extend along an axis $E_1$ that is generally parallel to and positioned between axes $D_1$ and $D_3$ that proximal edges $134_1$ and $134_3$ extend along respectively. In some embodiments, a proximal edge $134_2$ of the third semiconductor die $130_2$ of the third plurality of semiconductor dies 130 may extend along axis $E_1$. In other embodiments, proximal edge $134_2$ may be proximate axis $E_1$.

In some embodiments, the semiconductor dies included in the fourth plurality of semiconductor dies 140 are stacked on top of one another similar to the semiconductor dies of the first plurality of semiconductor dies 110. For example, the semiconductor dies of the fourth plurality of semiconductor dies 140 may be stacked on top of one another in a staircase-like pattern. In some embodiments, the fourth plurality of semiconductor dies 140 positioned along a fourth axis $A_4$. In some embodiments, fourth axis $A_4$ passes through the center of the first (e.g., bottom) and last (e.g., top) semiconductor dies of the fourth plurality of semiconductor dies 140. In some embodiments, the fourth axis $A_4$ is generally parallel to the first axis $A_1$ of the first plurality of semiconductor dies 110, generally parallel to the second axis $A_2$ of the second plurality of semiconductor dies 120, and generally parallel to the third axis $A_3$ of the third plurality of semiconductor dies 130. In some embodiments, the fourth axis $A_4$ is spaced from the first axis $A_1$, the second axis $A_2$, and the third axis $A_3$. For example, the fourth axis $A_4$ may be disposed above the first axis $A_1$, the second axis $A_2$, and the third axis $A_3$ such that the fourth plurality of semiconductor dies 140 are disposed above the first plurality of semiconductor dies 110, the second plurality of semiconductor dies 120, and the third plurality of semiconductor dies 130. By providing the fourth plurality of semiconductor dies 140 above the third plurality of semiconductor dies 130 and positioning the fourth plurality of semiconductor dies 140 along axis $A_4$, the width w of the semiconductor device package 100 may be reduced as opposed to if the fourth plurality of semiconductor dies 140 were disposed along axis $A_1$.

In some embodiments, the perpendicular distance between axis $A_1$ and axis $A_2$ is generally equal to the perpendicular distance between axis $A_2$ and axis $A_3$. In some embodiments, the perpendicular distance between axis $A_2$ and axis $A_3$ is generally equal to the distance between axis $A_3$ and $A_4$. In some embodiments, the perpendicular distance between axis $A_1$ and axis $A_2$ is generally equal to the perpendicular distance between axis $A_3$ and axis $A_4$. In some embodiments, one or more of axes $A_1$, $A_2$, $A_3$, and $A_4$ may not be parallel with another axis. For example, axis $A_4$ may have an angle with respect to axis H that is not equal to the angle θ of axis $A_1$. In some embodiments, each of the pluralities of semiconductor dies 110, 120, 130, and 140 include the same number of semiconductor dies. For example, as shown in FIG. 1, each of the pluralities of semiconductor dies includes eight semiconductor dies. In some embodiments, the pluralities of semiconductor dies 110, 120, 130, and 140 may each include two, three, four, five, six, seven, eight, or greater than eight semiconductor dies. In some embodiments, the pluralities of semiconductor dies 110, 120, 130, and 140 may each include at least two stacked semiconductor dies. In other embodiments, one or more of the pluralities of semiconductor dies 110, 120, 130, and 140 may include a number of semiconductor dies that is different from another of the plurality of semiconductor dies 110, 120, 130, and 140. For example, the first plurality of semiconductor dies 110 may include eight semiconductor dies and the second plurality of semiconductor dies 120 may include six semiconductor dies. In some embodiments the plurality of semiconductor dies 110, 120, 130, 140 may be positioned relative to one another such that, a vertical axis V, perpendicular to axis H, intersects each semiconductor device of each plurality of semiconductor dies 110, 120, 130, and 140. Vertical axis V, in some embodiments, intersects with and is oblique to axes $A_1$, $A_2$, $A_3$, and $A_4$. While the illustrated embodiment shows four different pluralities of semiconductor dies 110, 120, 130, and 140, other embodiments may include fewer or greater pluralities of semiconductor dies. In some embodiments, at least two pluralities of semiconductors dies are included.

In some embodiments, each semiconductor die included in a plurality of semiconductor dies may be interconnected to each other semiconductor die included in the same plurality of semiconductor dies. For example, the first plurality of semiconductor dies 110 may include one or more bond wires $104_1$ electrically coupling each of the semiconductor dies included in the first plurality of semiconductor dies 110 to one another. In some embodiments, the first die bond wire $104_1$ may be wire bonded to each of the semiconductor dies of the first plurality of semiconductor dies 110. In some embodiments, the second plurality of semiconductor dies 120 may include one or more second die bond wires $104_2$ electrically coupling each of the semiconductor dies included in the second plurality of semiconductor dies 120 to one another. In some embodiments, the second die bond wire $104_2$ may be wire bonded to each of the semiconductor dies of the second plurality of semiconductor dies 120. In some embodiments, the third plurality of semiconductor dies 130 may include one or more wires $104_3$ electrically coupling each of the semiconductor dies included in the third plurality of semiconductor 130 to one another. In some embodiments, the wire $104_3$ may be wire bonded to each of the semiconductor dies of the third plurality of semiconductor dies 130. In some embodiments, the fourth plurality of semiconductor dies 140 may include one or more wires $104_4$ electrically coupling each of the semiconductor dies included in the fourth plurality of semiconductor 140 to one another. In some embodiments, the wire $104_4$ may be wire bonded to each of the semiconductor dies of the fourth plurality of semiconductor dies 140. In some embodiments, bond wires $104_1$-$104_4$ may be comprised of, for example, aluminum, copper, silver, gold, or a combination thereof. In some embodiments, bond wires $104_1$-$104_4$ may have a diameter of about 15 micrometers.

In some embodiments, the semiconductor device package 100 includes a redistribution layer (RDL) 105 for electrically coupling to each of the plurality of semiconductor dies 110, 120, 130, and 140. In some embodiments, the RDL 105 includes a layer having electrical connections (e.g., electrical wiring and/or electrical traces) configured to spread the contact points for each of the plurality of semiconductor dies 110, 120, 130, and 140 across an area such that an array of solder balls may be coupled to the semiconductor device package 100 for conducting electrical signals between the semiconductor device package 100 and one or more other devices. In some embodiments, the RDL 105 includes a layer of polymer having one or more signal traces (e.g., copper wires) dispersed throughout the layer of polymer. In some embodiments, the RDL 105 is disposed above the fourth plurality of semiconductor dies 140. In some embodiments, RDL 105 is disposed above each of the pluralities of semiconductor dies 110, 120, 130, and 140. In some embodiments, the semiconductor device package 100 includes a plurality of solder balls 106 configured to electrically couple to each plurality of semiconductor dies 110, 120, 130, and 140. In some embodiments, the plurality of solder balls 106 is disposed above the fourth plurality of semiconductor dies 140. In some embodiments, the plurality of solder balls 106 is coupled to and disposed above the RDL 105. In some embodiments, the plurality of solder balls 106 are in electrical communication with the signal trace of the RDL 105.

In some embodiments, the semiconductor device package 100 includes one or more connecting elements electrically connecting the RDL 105, which in turn is electrically connected to the solder balls 106, to each of the plurality of semiconductor dies 110, 120, 130, 140. In some embodiments, each plurality of semiconductor dies 110, 120, 130, 140 is electrically connected to RDL 105 via a separate connecting element. In some embodiments, each connecting element is or includes a bond wire that extends, generally vertically, from RDL 105 to a die in one of the pluralities of semiconductor dies 110, 120, 130, 140. In some embodiments, the semiconductor device package 100 includes a first vertical bond wire 108 electrically coupling the plurality of solder balls 106 to the first plurality of semiconductor dies 110. In some embodiments, the first vertical bond wire 108 may be an electrically conductive wire coupled to the first plurality of semiconductor dies 110 and the RDL 105. In some embodiments, the first vertical bond wire 108 may be comprised of an electrically conductive material (e.g., copper). In some embodiments, the semiconductor device package 100 includes a second vertical bond wire 111 electrically coupling the plurality of solder balls 106 to the second plurality of semiconductor dies 120. In some embodiments, the second vertical bond wire 111 may be an electrically conductive wire coupled to the second plurality of semiconductor dies 120 and the RDL 105. In some embodiments, the second vertical bond wire 111 may be comprised of an electrically conductive material (e.g., copper). In some embodiments, the semiconductor device package 100 includes a third vertical bond wire 112 electrically coupling the plurality of solder balls 106 to the third plurality of semiconductor dies 130. In some embodiments, the third vertical bond wire 112 may be an electrically conductive wire coupled to the third plurality of semiconductor dies 130 and the RDL 105. In some embodiments, the third vertical bond wire 112 may be comprised of an electrically conductive material (e.g., copper). In some embodiments, the semiconductor device package 100 includes a fourth vertical bond wire 114 electrically coupling the plurality of solder balls 106 to the fourth plurality of semiconductor dies 140. In some embodiments, the fourth vertical bond wire 114 may be an electrically conductive wire coupled to the fourth plurality of semiconductor dies 140 and the RDL 105. In some embodiments, the fourth vertical bond wire 114 may be comprised of an electrically conductive material (e.g., copper).

In some embodiments, the semiconductor device package 100 may include one or more encapsulants that at least partially encapsulate one or more components of package 100. For example, plurality of semiconductor dies 110, 120, 130, and 140 may be at least partially encapsulated in first, second, third, and fourth encapsulants $102_1$, $102_2$, $102_3$, and $102_4$, respectively. In some embodiments, each encapsulant $102_1$, $102_2$, $102_3$, and $102_4$ is comprised of the same material. In some embodiments, each encapsulant $102_1$, $102_2$, $102_3$, and $102_4$ is comprised of an epoxy mold compound (EMC) or other encapsulating material that is molded and cured around the components of the semiconductor device package 100. In some embodiments, one or more of encapsulants $102_1$, $102_2$, $102_3$, and $102_4$ includes a ceramic, glass, thermoplastic, thermoset resin, or a composite thereof. In some embodiments, at least some of the encapsulant material is disposed over the top surface of each of the plurality of semiconductor dies, forming a layer that separates one plurality of semiconductor dies from an adjacent plurality of semiconductor dies. In the illustrated embodiment, there is a layer of one of encapsulants $102_1$, $102_2$, $102_3$, and $102_4$ disposed between two or more of the plurality of semiconductor dies. For example, as shown in FIG. 1, there is a layer of encapsulant $102_1$ disposed between the first plurality of semiconductor dies 110 and the second plurality of semiconductor dies 120. In some embodiments, the layer of encapsulant $102_1$ may be disposed between the top surface of the first plurality of semiconductor dies 110 and the bottom surface of the second plurality of semiconductor dies 120.

In some embodiments, the top surface of the first plurality of semiconductor dies 110 may be defined by the top surface of the upper most semiconductor device of the first plurality of semiconductor dies 110. For example, the top surface of the semiconductor die of the first plurality of semiconductor dies 110 that is proximate the top planar surface $107_1$ of first encapsulant $102_1$ may define the top surface of semiconductor device 110. In some embodiments, the bottom surface of the bottom most semiconductor device of the second plurality of semiconductor dies 120 may define the bottom surface of the second plurality of semiconductor dies 120. For example, the bottom surface of semiconductor device $120_1$ may define the bottom surface of the second plurality of semiconductor dies 120. In some embodiments, the second plurality of semiconductor dies 120 is coupled to the top planar surface $107_1$ of the first encapsulant $102_1$.

In some embodiments, each of the vertical bond wires 108, 111, and 112 include one or more extensions electrically connected one upon another such that each vertical bond wire 108, 111, and 112 is exposed at the top planar surface $107_4$ of the fourth encapsulant $102_4$, as discussed in more detail with reference to FIGS. 2E-2J. In some embodiments, the extensions allow the vertical bond wires 108, 111, and 112 to be electrically connected to RDL 105. The extensions may be generally comprised of the same material such that each vertical bond wire 108, 111, and 112 is comprised of the same material. In some embodiments, the vertical bond wires 108, 111, and 112 are extended via a wire bonding process in which a ball of conductive material coupled to a conductive wire is bonded to a respective vertical bond wire 108, 111, and 112 proximate the top planar surface $107_1$, $107_2$ and $107_3$ of a corresponding encapsulant $102_1$, $102_2$, $102_3$. In some embodiments, the extensions are wire bonded via ultrasonic vibration and/or thermal bonding. In the embodiment shown in FIG. 1A, the fourth vertical bond wire 114 is coupled to the uppermost plurality of semiconductor dies (e.g., the fourth plurality of semiconductor dies 140) and is exposed at a top planar surface $107_4$ of the fourth encapsulant $102_4$ such that the fourth vertical bond wire 114 is electrically connected to RDL without requiring any extension as described above. However, it will be understood that additional pluralities of dies may be stacked above the fourth plurality of semiconductor dies 140 such that the fourth vertical bond wire 114 may be extended via the methods discussed herein.

In some embodiments, the third plurality of semiconductor dies 130 is coupled to the top planar surface $107_2$ of the second encapsulant $102_2$. In some embodiments, there is a layer of encapsulant $102_2$ disposed between the second plurality of semiconductor dies 120 and the third plurality of semiconductor dies 130. In some embodiments, the layer of encapsulant $102_2$ may be disposed between the top surface of the second plurality of semiconductor dies 120 and the bottom surface of the third plurality of semiconductor dies 130. In some embodiments, the fourth plurality of semiconductor dies 140 is coupled to the top planar surface $107_3$ of the third encapsulant $102_3$. In some embodiments, there is a layer of encapsulant $102_3$ disposed between the third plurality of semiconductor dies 130 and the fourth plurality of semiconductor dies 140. In some embodiments, the layer of encapsulant $102_3$ may be disposed between the top surface of the third plurality of semiconductor dies 130 and the bottom surface of the fourth plurality of semiconductor dies 140. In some embodiments, the RDL 105 is coupled to a top planar surface $107_4$ of the fourth encapsulant $102_4$. In some embodiments, there may be a layer of encapsulant $102_4$ disposed between the fourth plurality of semiconductor dies 140 and the RDL 105. In some embodiments, the layer of encapsulant $102_4$ may be disposed between the top surface of the fourth plurality of semiconductor dies 140 and the bottom surface of RDL 105. In some embodiments, the bottom surface 101 of the first plurality of semiconductor dies 110 may not be covered by encapsulant $102_1$. In some embodiments, a protective cover may be coupled to the bottom surface 101 of the first plurality of semiconductor dies 110.

In some embodiments, the semiconductor device package 100 includes a control die 150 configured to control signals sent to and from one or more of the pluralities of semiconductor dies 110, 120, 130, and 140. The control die 150 may be disposed between the RDL 105 and the top planar surface $107_2$ of the second encapsulant $102_2$. In some embodiments, the control die 150 is coupled to the semiconductor device package between a top surface of the fourth plurality of semiconductor dies 140 and RDL 105. In some embodiments, the control die 150 is encapsulated in the fourth encapsulant $102_4$. In some embodiments, there is a layer of encapsulant $102_4$ between the control die 150 and the fourth plurality of semiconductor dies 140. The control die 150 may include one or more electrical connectors 152 configured to electrically couple the control die 150 to RDL 105. In some embodiments, the one or more electrical connectors 152 may be solder balls disposed along a surface of control die 150. In some embodiments, the control die 150 may be electrically connected to RDL 105 via a flip-chip bonding method where the one or more electrical connections 152 are directly connected to RDL 105. In other embodiments, a vertical bond wire (not shown) may electrically connect the one or more electrical connections 152 of control die 150 to RDL 105.

In some embodiments, the semiconductor device package 100 may include a different number of pluralities of semiconductor dies than what is shown in FIG. 1A and the control die 150 may be mounted to the top die of the top plurality of semiconductor dies included in the semiconductor device package 100. For example, if the semiconductor device package 100 includes only the first and second pluralities of semiconductor dies 110, 120, then the control die 150 may be mounted to the top die of the second plurality of semiconductor dies 120 similar to how the control die 150 is mounted to the fourth plurality of semiconductor dies 140 as described above. Additionally, the corresponding encapsulant of the upper most plurality of semiconductor dies (e.g., second encapsulant $102_2$ in this example) may at least partially encapsulate the control die 150. It will be understood that the RDL 105 and plurality of solder balls 106 may be coupled to the top planar surface of the uppermost encapsulant (e.g., top planar surface $107_2$ of second encapsulant $102_2$ in this example) such that RDL 105 is electrically connected to the corresponding vertical bond wires (e.g., second vertical bond wire 111, and first extension $108_1$ to the first vertical bond wire 108 in this example) and electrically connected to control die 150.

Figure 2A:
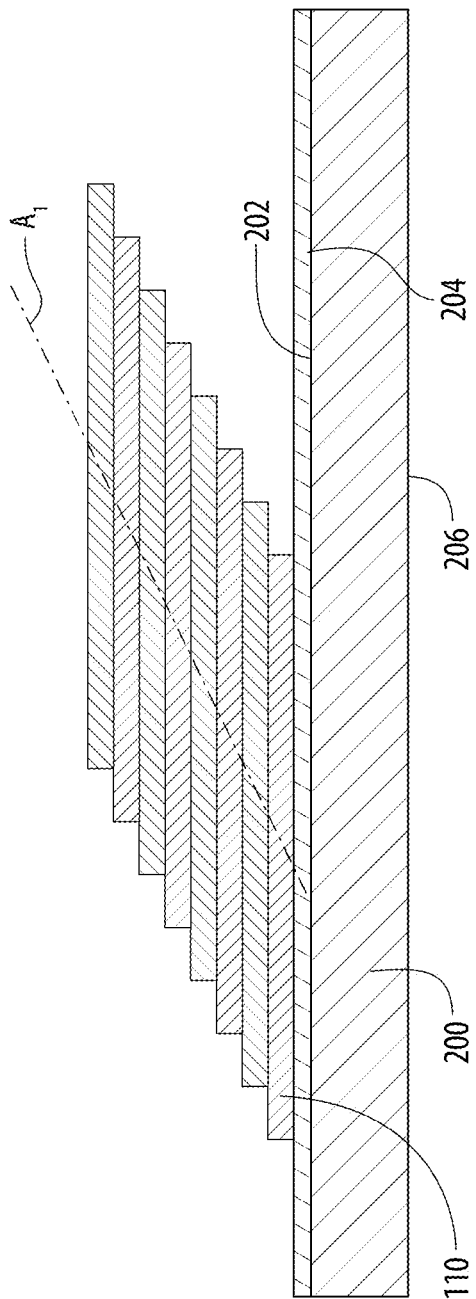

Referring to FIGS. 2A-2K there is shown a series of cross-sectional side view diagrams depicting a method of assembling the semiconductor device package 100 in accordance with an exemplary embodiment of the present disclosure. Referring to FIG. 2A, the first plurality of semiconductor dies 110 may be positioned on a top surface 202 of substrate 200. In some embodiments, each semiconductor die of the first plurality of semiconductor dies 110 are mounted one upon another and positioned along the first axis $A_1$ to form a first die stack. In some embodiments, the substrate 200 may be a removable substrate configured to be removed from the first plurality of semiconductor dies 110, for example, after assembly of semiconductor device package 100. In some embodiments, the substrate 200 includes a film 204 of material disposed on a top surface 202 of substrate 200 and configured to selectively couple and decouple the substrate 200 from the first plurality of semiconductor dies 110. In some embodiments, the film 204 includes adhesive on both sides of the film 204 for coupling the substrate 200 to the first plurality of semiconductor dies 110. In some embodiments the film 204 is an ultraviolet release film configured to decouple the substrate 200 from the first plurality of semiconductor dies 110 when the film 204 is subjected to ultraviolet light. In other embodiments, the film 204 may be a thermal release film.

Figure 2B:
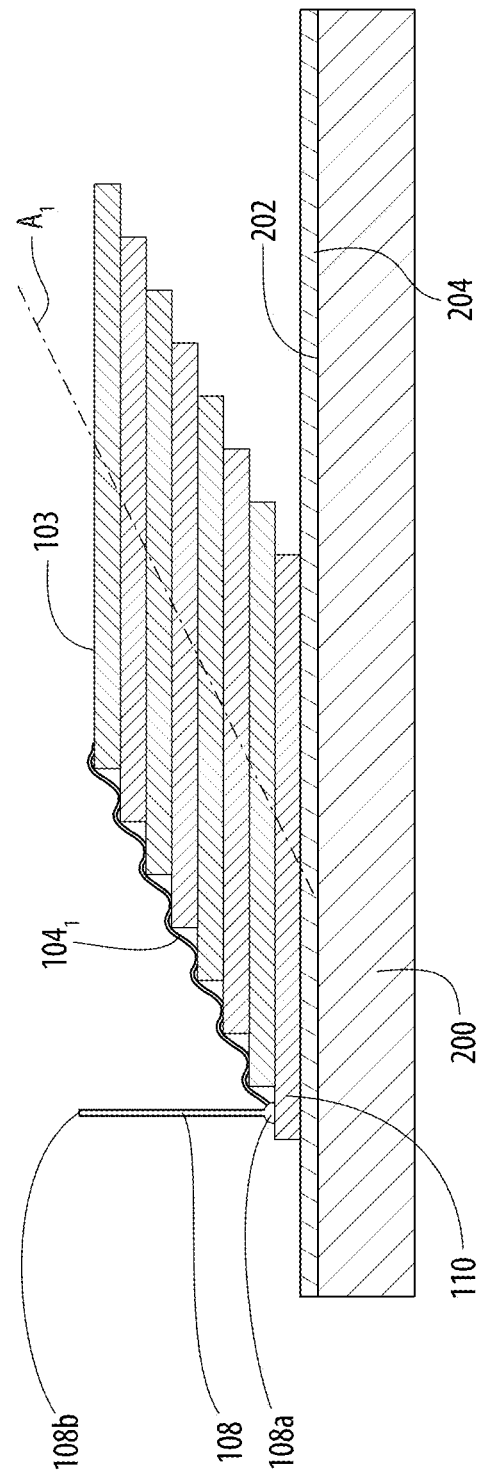

Referring to FIG. 2B, each semiconductor die of the first plurality of semiconductor dies 110 is electrically connected one to another, for example, with first die bond wires $104_1$. In some embodiments, the first die bond wires $104_1$ are wire bonded to each semiconductor die of the first plurality of semiconductor dies 110. In some embodiments, the first die bond wires $104_1$ are electrically coupled to each semiconductor die at a location where said semiconductor die is not overlaid by another semiconductor die (e.g., an adjacent semiconductor die). In some embodiments, a first vertical bond wire 108 is electrically coupled to the first plurality of semiconductor dies 110. In some embodiments, the first vertical bond wire 108 is vertically wire bonded to the semiconductor die of the first plurality of semiconductor dies 110 that is most proximate to the substrate 200. Put another way, the first vertical bond wire 108 is vertically wire bonded to the bottom, or first, semiconductor die of the first plurality of semiconductor dies 110. In some embodiments, the first vertical bond wire 108 is in electrical communication with the first die bond wire $104_1$. In some embodiments, the first vertical bond wire 108 extends vertically upward from the first plurality of semiconductor dies 110 a distance that is greater than the height of the first plurality of semiconductor dies 110. For example, the first vertical bond wire 108 may have a first end 108a coupled to the first plurality of semiconductor dies 110 and a second end 108b disposed opposite the first end 108a. The second end 108b of the first vertical bond wire 108 may be disposed above a top surface 103 of the first plurality of semiconductor dies 110.

Referring to FIG. 2C, a first encapsulant $102_1$ may be provided such that the first plurality of semiconductor dies 110, first die bond wire $104_1$ and first vertical bond wire 108 are at least partially encapsulated by encapsulant $102_1$. In some embodiments, a mold (not shown) may be used to form the encapsulant $102_1$ into the desired shape. In some embodiments, the first encapsulant $102_1$ may be liquefied and poured into the mold. The first encapsulant $102_1$ may then be cured or hardened around the first plurality of semiconductor dies 110, first die bond wire $104_1$ and the first vertical bond wire 108. The second end 108b of the first vertical bond wire 108 may be exposed at a top planar surface $107_1$ of the first encapsulant $102_1$. In some embodiments, a layer of top planar surface $107_1$ of the first encapsulant $102_1$ may be polished to remove said layer from the first encapsulant $102_1$ such that the second end 108b of the first vertical bond wire 108 is exposed. In some embodiments, polishing removes a thin surface layer of first encapsulant $102_1$ and may be achieved, for example, by using an abrasive. In other embodiments, the thin surface layer of first encapsulant $102_1$ may be removed by etching, machining, or cutting. In some embodiments, the first encapsulant $102_1$ is polished until the second end 108b of the first vertical bond wire 108 is flush with, or protrudes from, the top planar surface $107_1$ of the encapsulant 102. In some embodiments, the top surface 103 of the first plurality of semiconductor dies 110 may remain covered by a layer of encapsulant 102 after the encapsulant 102 has been polished.

Referring to FIG. 2D, a second plurality of semiconductor dies 120 may be provided such that the second plurality of semiconductor dies 120 are disposed above the first plurality of semiconductor dies 110. The second plurality of semiconductor dies 120 may be positioned on the top planar surface $107_1$ of the first encapsulant $102_1$. In some embodiments, the second plurality of semiconductor dies 120 are positioned along the top planar surface $107_1$ of first encapsulant $102_1$ such that the second end 108b of the first vertical bond wire 108 is not covered by the second plurality of semiconductor dies 120. This may allow the first vertical bond wire 108 to be extended in a vertical direction normal to the top planar surface $107_1$ of the first encapsulant $102_1$. In some embodiments, each semiconductor die of the second plurality of semiconductor dies 120 are mounted one upon another and positioned along the second axis $A_2$ to form a second die stack.

Figure 2E:
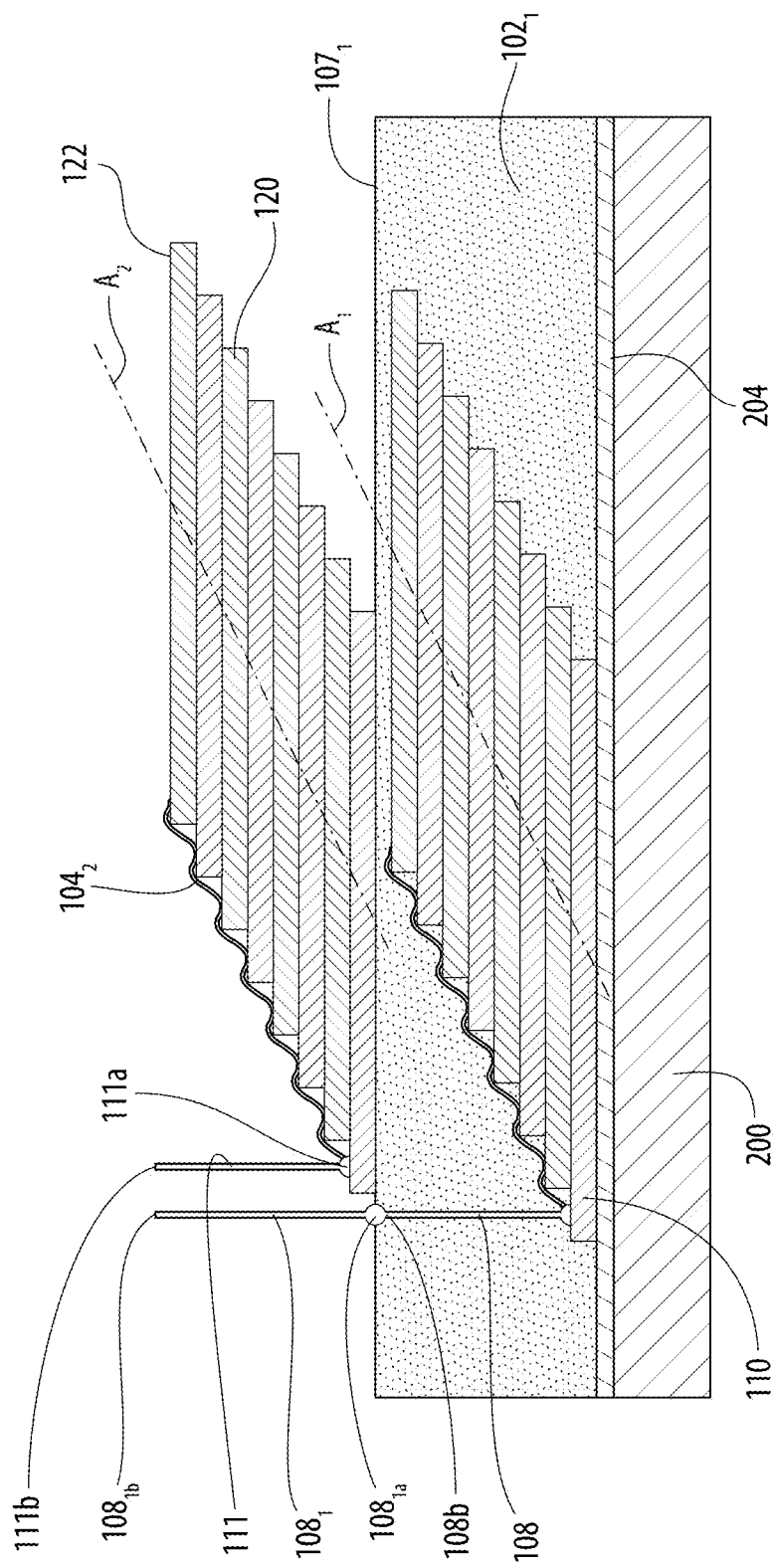

Referring to FIG. 2E, each semiconductor die of the second plurality of semiconductor dies 120 may be electrically connected one to another by a second die bond wire $104_2$ electrically coupled to each semiconductor device of the second plurality of semiconductor dies 120. In some embodiments, a second vertical bond wire 111 may be electrically coupled to the second plurality of semiconductor device 120. In some embodiments, the second vertical bond wire 111 is vertically wire bonded to the semiconductor die of the second plurality of semiconductor dies 120 that is proximal the top planar surface $107_1$ of the first encapsulant $102_1$. Put another way, the second vertical bond wire 111 is vertically wire bonded to the bottom, or first, semiconductor die of the second plurality of semiconductor dies 120. In some embodiments, the second vertical bond wire 111 is in electrical communication with the second die bond wire $104_2$. In some embodiments, the second vertical bond wire 111 extends vertically upward from the second plurality of semiconductor dies 120 a distance that is greater than the height of the second plurality of semiconductor dies 120. For example, the second vertical bond wire 111 may have a first end 111a coupled to the second plurality of semiconductor dies 120 and a second end 111b disposed opposite the first end 111a. The second end 111b of the second vertical bond wire 111 may be disposed above a top surface 122 of the second plurality of semiconductor dies 120.

In some embodiments, a first extension $108_1$ may be electrically connected to the first vertical bond wire 108 such that a terminal end of the first vertical bond wire 108 is generally level with a terminal end of the second vertical bond wire 111. For example, a first end $108_{1a}$ the first extension $108_1$ is electrically connected to the second end 108b of the first vertical bond wire 108 and a second end $108_{1b}$ of the first extension $108_1$, opposite the first end $108_{1a}$, is generally level with the second end 111b of the second vertical bond wire 111. The first extension $108_1$ may be vertically wire bonded to the first vertical bond wire 108 such that the vertical bond wire 108 is extended from what is shown in FIG. 2D to what is shown in FIG. 2E. In some embodiments, the first vertical bond wire 108 is extended via a wire bonding process in which a ball of conductive material proximate the first end $108_{1a}$ of the first extension $108_1$ is bonded to the first vertical bond wire 108. For example, the ball of conductive material may be positioned proximate the second end 108b of the first vertical bond wire 108, in the state shown in FIG. 2D, and bonded to the second end 108b via ultrasonic vibration and/or heat such that the first vertical bond wire 108 is in a state as shown in FIG. 2E wherein the length of the first vertical bond wire has increased. This process may be repeated for each additional plurality of semiconductor dies added to the semiconductor device package 100 and for each of vertical bond wires 111, 112, and 114. The first extension $108_1$ and first vertical bond wire 108 may be substantially parallel with the second vertical bond wire 111. Substantially parallel may refer to +/−10 degrees.

Figure 2F:
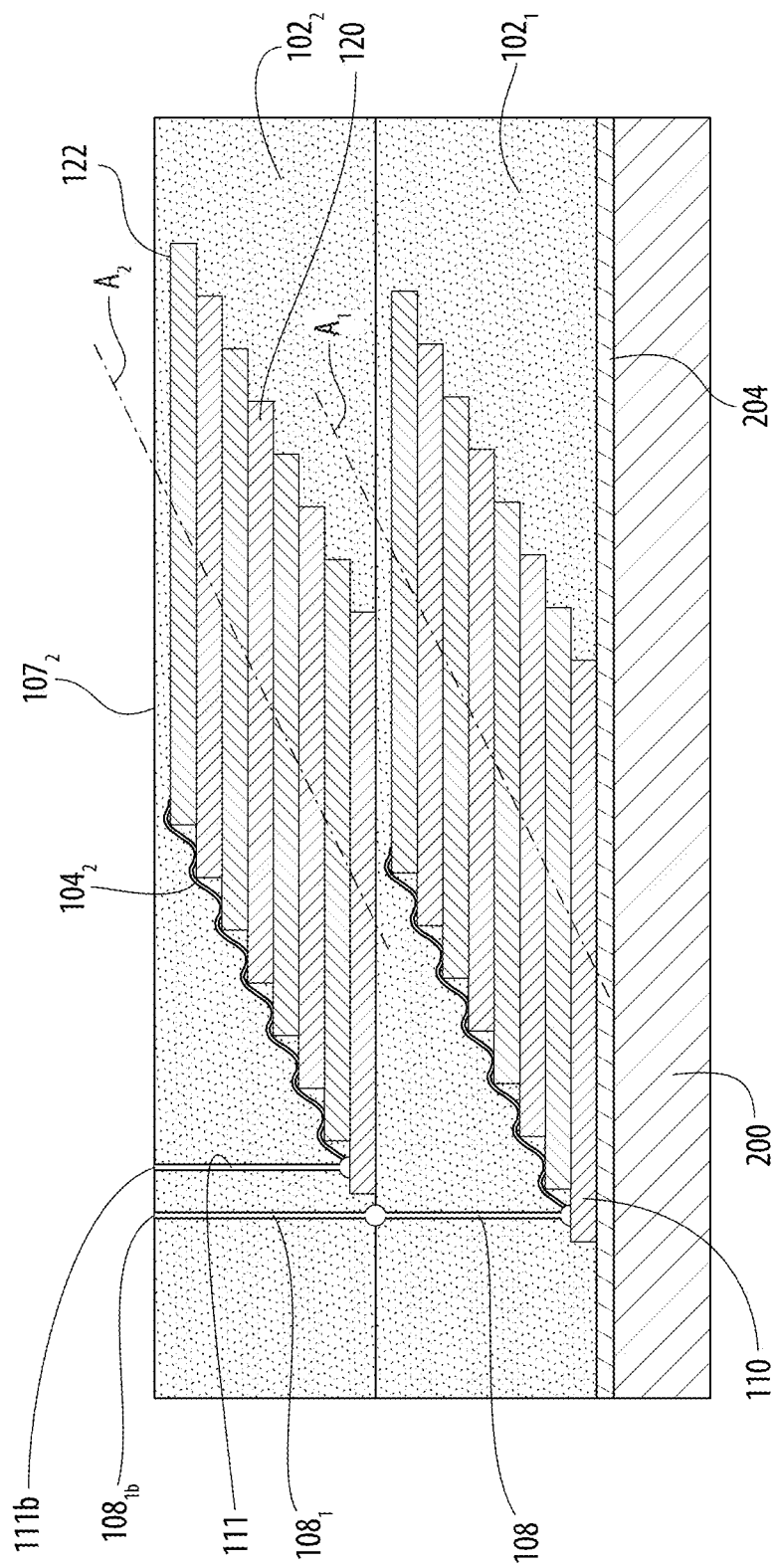

Referring to FIG. 2F, the second plurality of semiconductor dies 120, second die bond wire $104_2$, the first extension $108_1$ of the first vertical bond wire 108, and the second vertical bond wire 111 are at least partially encapsulated by a second encapsulant $102_2$. In some embodiments, a mold (not shown) may be used to form the second encapsulant $102_2$ into the desired shape. In some embodiments, the second encapsulant $102_2$ may be liquefied and poured into the mold. The second encapsulant $102_2$ may then be cured or hardened around the second plurality of semiconductor dies 120, second die bond wire $104_2$, the first extension $108_1$ to the first die bond wire 108 and the second vertical bond wire 111. In some embodiments, a top layer of the second encapsulant $102_2$ may be polished to remove said top layer from the second encapsulant $102_2$. In some embodiments, the encapsulant 102 is polished until the second end $108_{1b}$ of the first extension $108_1$ to the first vertical bond wire 108 and the second end 111b of the second vertical bond wire 111 are exposed at a top planar surface $107_2$ of the second encapsulant 102. In some embodiments, the top surface 122 of the second plurality of semiconductor dies 120 may remain covered by the top planar surface $107_2$ of the second encapsulant 102 after the second encapsulant 102 has been polished. In some embodiments, the second encapsulant $102_2$ and first encapsulant $102_1$ are comprised of the same material.

Figure 2G:
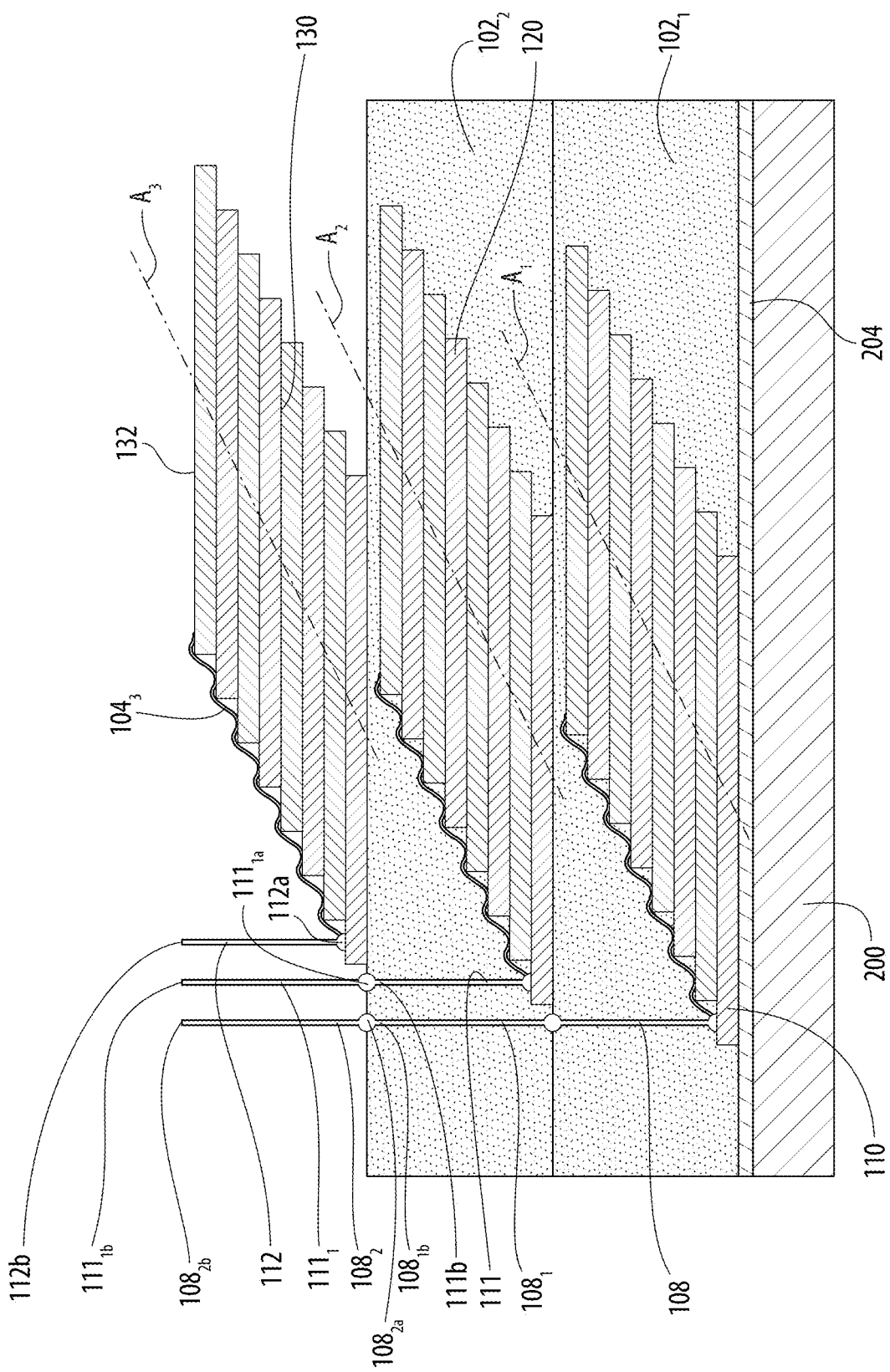

Referring to FIG. 2G, a third plurality of semiconductor dies 130 may be provided such that the third plurality of semiconductor dies 130 are disposed above the second plurality of semiconductor dies 120. The third plurality of semiconductor dies 130 may be positioned on the top planar surface $107_2$ of the second encapsulant $102_2$. In some embodiments, the third plurality of semiconductor dies 130 are positioned along the top planar surface $107_2$ of the second encapsulant $102_2$ such that the second end $108_{1b}$ of the first extension $108_1$ to the first vertical bond wire 108, and the second end 111b of the second vertical bond wire 111 are not covered by the third plurality of semiconductor dies 130. This may allow the first vertical bond wire 108 and/or the second vertical bond wire 111 to be extended in a vertical direction normal to the top planar surface $107_2$ of the second encapsulant $102_2$. In some embodiments, each semiconductor die of the third plurality of semiconductor dies 130 are mounted one upon another and positioned along the third axis $A_3$ to form a third die stack. In some embodiments, the third axis $A_3$ is generally parallel to and spaced from axes $A_1$ and $A_2$.

Still referring to FIG. 2G, each semiconductor die of the third plurality of semiconductor dies 130 may be electrically connected one to another by a third die bond wire $104_3$ electrically coupled to each semiconductor device of the third plurality of semiconductor dies 130. In some embodiments, a third vertical bond wire 112 may be electrically coupled to the third plurality of semiconductor dies 130. In some embodiments, the third vertical bond wire 112 is vertically wire bonded to the semiconductor die of the third plurality of semiconductor dies 130 that is proximate the top planar surface $107_2$ of second encapsulant $102_2$. Put another way, the third vertical bond wire 112 is vertically wire bonded to the bottom, or first, semiconductor die of the third plurality of semiconductor dies 120. In some embodiments, the third vertical bond wire 112 is in electrical communication with the third die bond wire $104_3$. In some embodiments, the third vertical bond wire 112 extends vertically upward from the third plurality of semiconductor dies 130 a distance that is greater than the height of the third plurality of semiconductor dies 130. For example, the third vertical bond wire 112 may have a first end 112a coupled to the third plurality of semiconductor dies 130 and a second end 112b disposed opposite the first end 112a. The second end 112b of the third vertical bond wire 112 may be disposed above a top surface 132 of the third plurality of semiconductor dies 130.

In some embodiments, a second extension $108_2$ is electrically connected to the first extension $108_1$ to the first vertical bond wire 108 such that a terminal end of the first vertical bond wire 108 is generally level with a terminal end of the third vertical bond wire 112. In some embodiments, a first extension $111_1$ is electrically connected to the second vertical bond wire 111 such that a terminal end of the second vertical bond wire 111 is generally level with a terminal end of the third vertical bond wire. For example, a first end $108_{2a}$ of the second extension $108_2$ is electrically connected to the second end $108_{1b}$ of the first extension $108_1$ to the first vertical bond wire 108 and a second end $108_{2b}$ of the second extension $108_2$, opposite the first end $108_{2a}$, is generally level with the second end 112b of the third vertical bond wire 112. A first end $111_{1a}$ of the first extension $111_1$ is electrically connected to the second end 111b of the second vertical bond wire 111 and a second end $111_{1b}$ of the first extension $111_1$, opposite the first end $111_{1a}$, is generally level with the second end 112b of the third vertical bond wire 112. The second extension $108_2$ to the first vertical bond wire 108 and first extension $111_1$ to the second vertical bond wire 111 may be vertically wire bonded to the first extension $108_1$ to the first vertical bond wire 108 and the second vertical bond wire 111 respectively such that the vertical bond wires 108 and 111 are extended from what is shown in FIG. 2F to what is shown in FIG. 2G. In some embodiments, the first and second vertical bond wires 108 and 111 are extended via the wire bonding process as discussed above with reference to FIG. 2D.

Figure 2H:
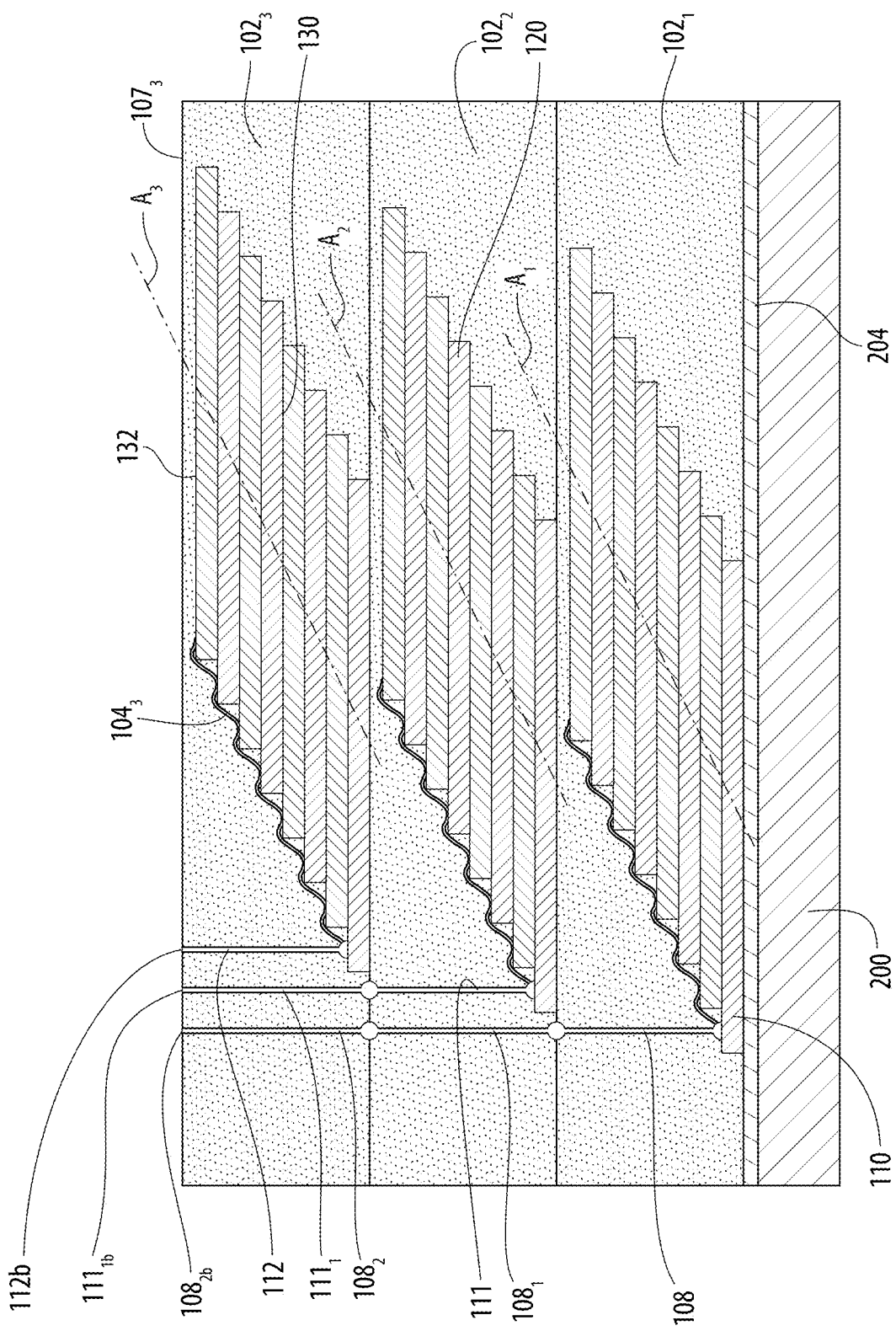

Referring to FIG. 2H, the third plurality of semiconductor dies 130, third die bond wire $104_3$, the second extension $108_2$ to the first vertical bond wire 108, the first extension $111_1$ to the second vertical bond wire 111, and the third vertical bond wire 112 are at least partially encapsulated by a third encapsulant $102_3$. In some embodiments, a mold (not shown) may be used to form the third encapsulant $102_3$ into the desired shape. In some embodiments, the third encapsulant $102_3$ may be liquefied and poured into the mold. The third encapsulant $102_3$ may then be cured or hardened around the third plurality of semiconductor dies 130, third die bond wire $104_3$, the second extension $108_2$ to the first vertical bond wire 108, the first extension $111_1$ to the second vertical bond wire 111, and the third vertical bond wire 112. In some embodiments, a top layer of the third encapsulant $102_3$ may be polished to remove said top layer from the third encapsulant $102_3$. In some embodiments, the encapsulant 102 is polished until the second end $108_{2b}$ of the second extension $108_2$ to the first vertical bond wire 108, the second end $111_{1b}$ of the first extension $111_1$ to the second vertical bond wire 111, and the second end 112b of the third vertical bond wire 112 are exposed at the top planar surface $107_3$ of the third encapsulant $102_3$. In some embodiments, the top surface 132 of the third plurality of semiconductor dies 130 may remain covered by the top planar surface $107_3$ of the third encapsulant $102_3$ after the third encapsulant $102_3$ has been polished.

Figure 2I:
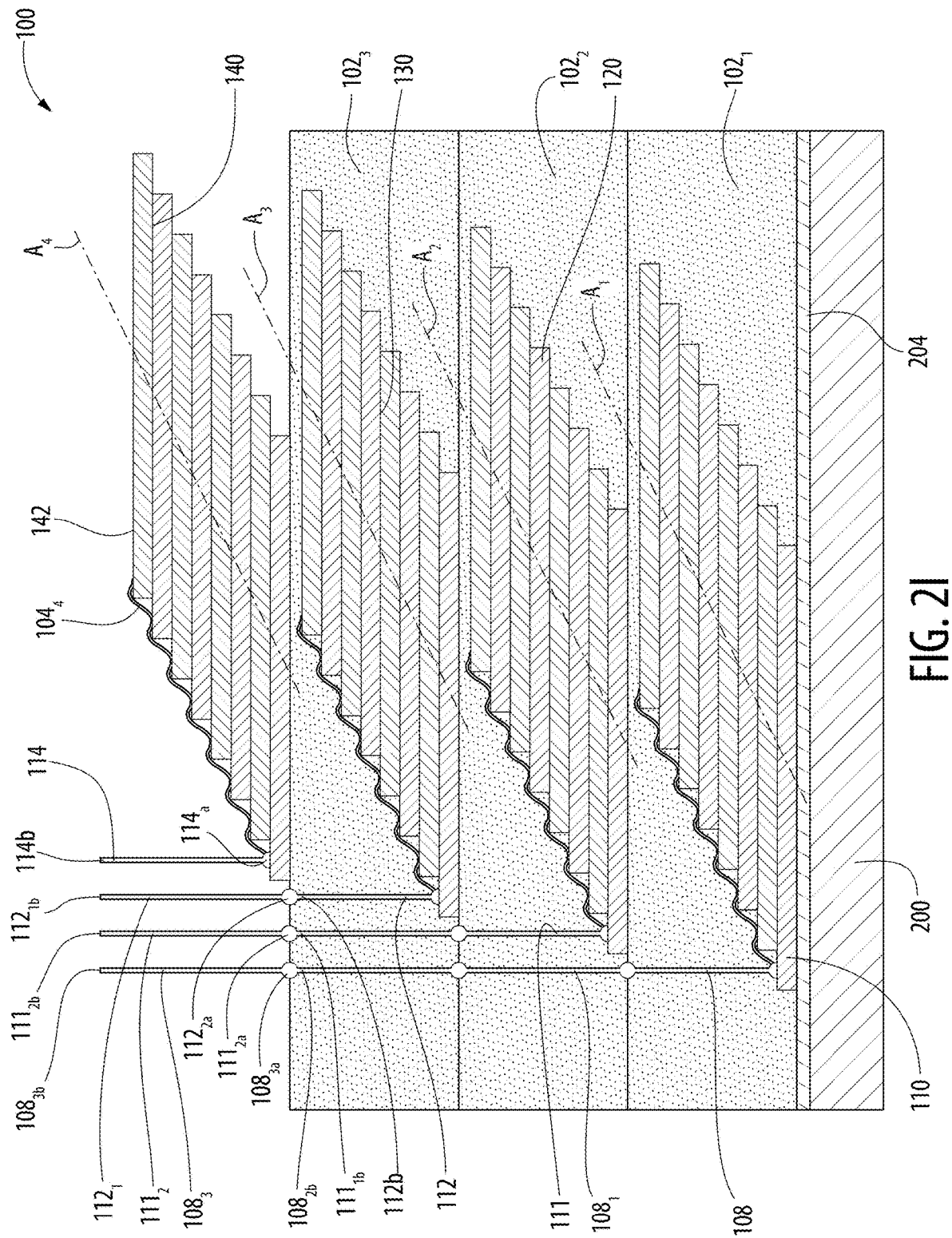

Referring to FIG. 2I, a fourth plurality of semiconductor dies 140 may be provided such that the fourth plurality of semiconductor dies 140 are disposed above the third plurality of semiconductor dies 130. The fourth plurality of semiconductor dies 140 may be positioned on the top planar surface $107_3$ of the third encapsulant $102_3$. In some embodiments, the fourth plurality of semiconductor dies 140 are positioned along the top planar surface $107_3$ of the third encapsulant $102_3$ such that the second end $108_{2b}$ of the second extension $108_2$ to the first vertical bond wire 108, the second end $111_{1b}$ of first extension $111_1$ to the second vertical bond wire 111, and the second end 112b of the third vertical bond wire 112 are not covered by the fourth plurality of semiconductor dies 140. This may allow the first vertical bond wire 108, the second vertical bond wire 111, and/or the third vertical bond wire 112 to be extended in a vertical direction normal to the top planar surface $107_3$ of the third encapsulant $102_3$. In some embodiments, the fourth plurality of semiconductor dies 140 are positioned along axis $A_4$ to form a fourth die stack. In some embodiments, the fourth axis $A_4$ is generally parallel to and spaced from axes $A_1$, $A_2$ and $A_3$.

Still referring to FIG. 2I, each semiconductor die of the fourth plurality of semiconductor dies 140 may be electrically connected one to another by a fourth die bond wire $104_4$ electrically coupled to each semiconductor device of the fourth plurality of semiconductor dies 140. In some embodiments, a fourth vertical bond wire 114 may be electrically coupled to the fourth plurality of semiconductor dies 140. In some embodiments, the fourth vertical bond wire 114 is vertically wire bonded to the semiconductor die of the fourth plurality of semiconductor dies 140 proximate the top planar surface $107_4$ of the fourth encapsulant $102_4$. Put another way, the fourth vertical bond wire 112 is vertically wire bonded to the bottom, or first, semiconductor die of the fourth plurality of semiconductor dies 140. In some embodiments, the fourth vertical bond wire 114 is in electrical communication with the fourth die bond wire $104_4$. In some embodiments, the fourth vertical bond wire 114 extends vertically upward from the fourth plurality of semiconductor dies 140 a distance that is greater than the height of the fourth plurality of semiconductor dies 140. For example, the fourth vertical bond wire 114 may have a first end 114a coupled to the fourth plurality of semiconductor dies 140 and a second end 114b disposed opposite the first end 114a. The second end 114b of the fourth vertical bond wire 114 may be disposed above a top surface 142 of the fourth plurality of semiconductor dies 140.

In some embodiments, a third extension $108_3$ is electrically connected to the second extension $108_2$ to the first vertical bond wire 108 such that a terminal end of the first vertical bond wire 108 is generally level with a terminal end of the fourth vertical bond wire 114. In some embodiments, a second extension $111_2$ is electrically connected to the first extension $111_1$ to the second vertical bond wire 111 such that a terminal end of the second vertical bond wire 111 is generally level with a terminal end of the fourth vertical bond wire 114. In some embodiments, a first extension $112_1$ is electrically connected to the third vertical bond wire 112 such that a terminal end of the third vertical bond wire 112 is generally level with a terminal end of the fourth vertical bond wire 114. For example, a first end $108_{3a}$ of the third extension $108_3$ is electrically connected to the second end $108_{2b}$ of the second extension $108_2$ to the first vertical bond wire 108 and a second end $108_{3b}$ of the third extension $108_3$, opposite the first end $108_{3a}$, is generally level with the second end 114b of the fourth vertical bond wire 114. A first end $111_{2a}$ of the second extension $111_2$ is electrically connected to the second end $111_{1b}$ of the first extension $111_1$ to the second vertical bond wire 111 and a second end $111_{2b}$ of the second extension $111_2$, opposite the first end $111_{2a}$, is generally level with the second end 114b of the fourth vertical bond wire 114. A first end $112_{1a}$ of the first extension $112_1$ is electrically connected to the second end 111b of the third vertical bond wire 112 and a second end $112_{1b}$ of the first extension $112_1$, opposite the first end $112_{1a}$, is generally level with the second end 114b of the fourth vertical bond wire 114. The third extension $108_3$ to the first vertical bond wire 108, the second extension $111_2$ to the second vertical bond wire 111, and the first extension $112_1$ to the third vertical bond wire 112 may be vertically wire bonded to the second extension $108_2$ to the first vertical bond wire 108, the first extension $111_1$ to the second vertical bond wire 111, and the third vertical bond wire 112 respectively such that the vertical bond wires 108, 111 and 112 are extended from what is shown in FIG. 2H to what is shown in FIG. 2I. In some embodiments, the first, second, and third vertical bond wires 108, 111, and 112 are extended via the wire bonding process as discussed above with reference to FIG. 2D.

Figure 2J:
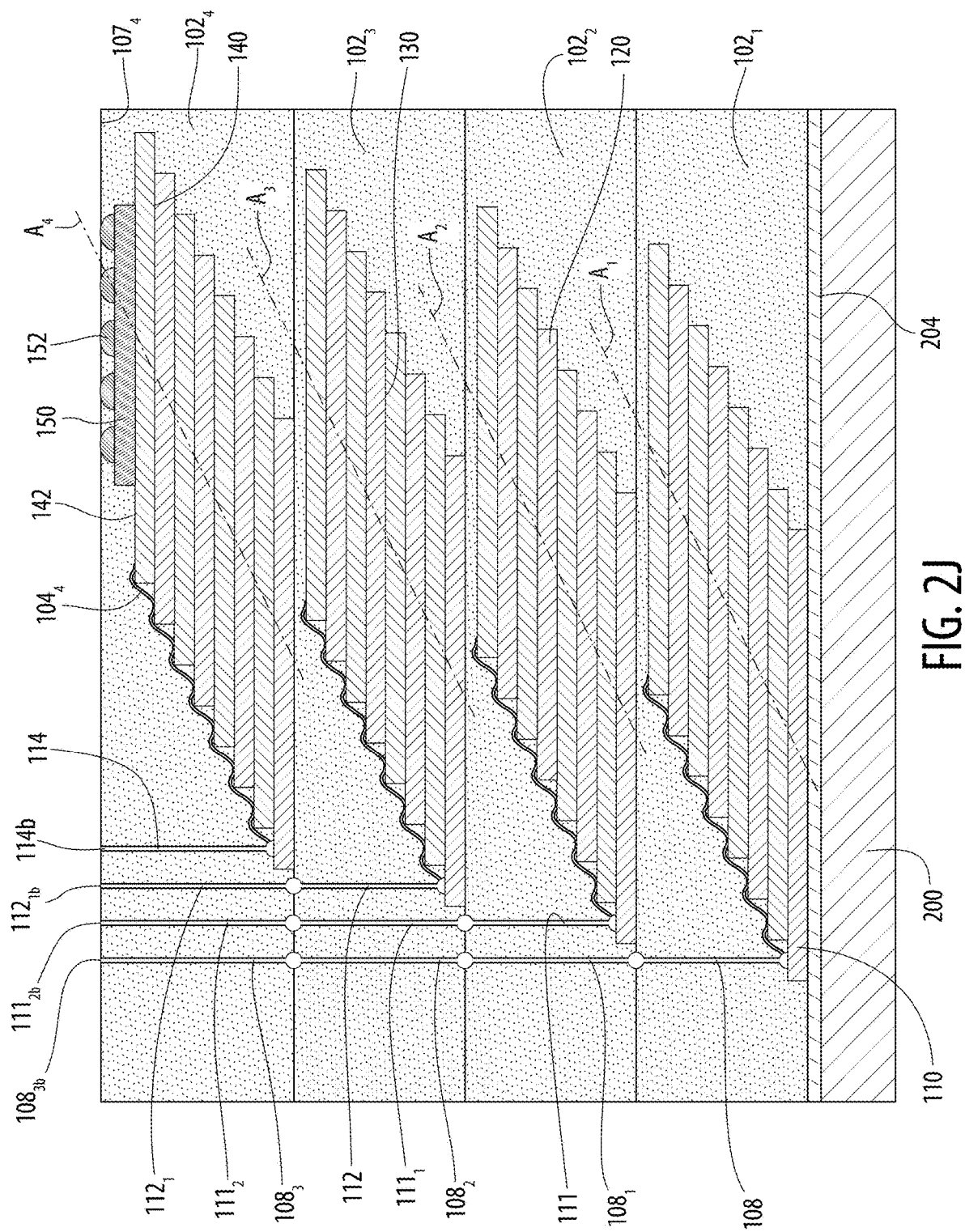

Referring to FIG. 2J, a control die 150 configured to control signals sent to and from the pluralities of semiconductor dies 110, 120, 130 and 140 may be coupled to the fourth plurality of semiconductor dies 140. In some embodiments, the control die 150 is positioned on the top surface 142 of the fourth plurality of semiconductor dies 140 and oriented such that the electrical connectors 152 of the control die face upwardly and away from the top surface 142 of the fourth plurality of semiconductor dies 140. The fourth plurality of semiconductor dies 140, control die 150, fourth die bond wire $104_4$, extensions $108_3$, $111_2$, $112_1$ and fourth vertical bond wire 114 may be at least partially encapsulated by a fourth encapsulant $102_4$. In some embodiments, a mold (not shown) may be used to form the fourth encapsulant $102_4$ into the desired shape. In some embodiments, the fourth encapsulant $102_4$ may be liquefied and poured into the mold. The fourth encapsulant $102_4$ may then be cured or hardened around the fourth plurality of semiconductor dies 140, control die 150, fourth die bond wire $104_4$, extensions $108_3$, $111_2$, $112_1$, and the fourth vertical bond wire 114. In some embodiments, a top layer of the fourth encapsulant $102_4$ may be polished to remove said top layer from the fourth encapsulant $102_4$. In some embodiments, the fourth encapsulant $102_4$ is polished until the second ends $108_{3b}$, $111_{2b}$, and $112_{1b}$ of extensions $108_3$, $111_2$, and $112_1$, respectively, at least a portion of the electrical connectors 152 of control die 150 and the second end 114b of the fourth vertical bond wire 114 are exposed at the top planar surface $107_4$ of the fourth encapsulant $102_4$. In some embodiments, the top surface 142 of the fourth plurality of semiconductor dies 140, and the control die 150 may remain covered by the top planar surface $107_4$ of the fourth encapsulant $102_4$ after the fourth encapsulant $102_4$ has been polished.

Figure 2K:
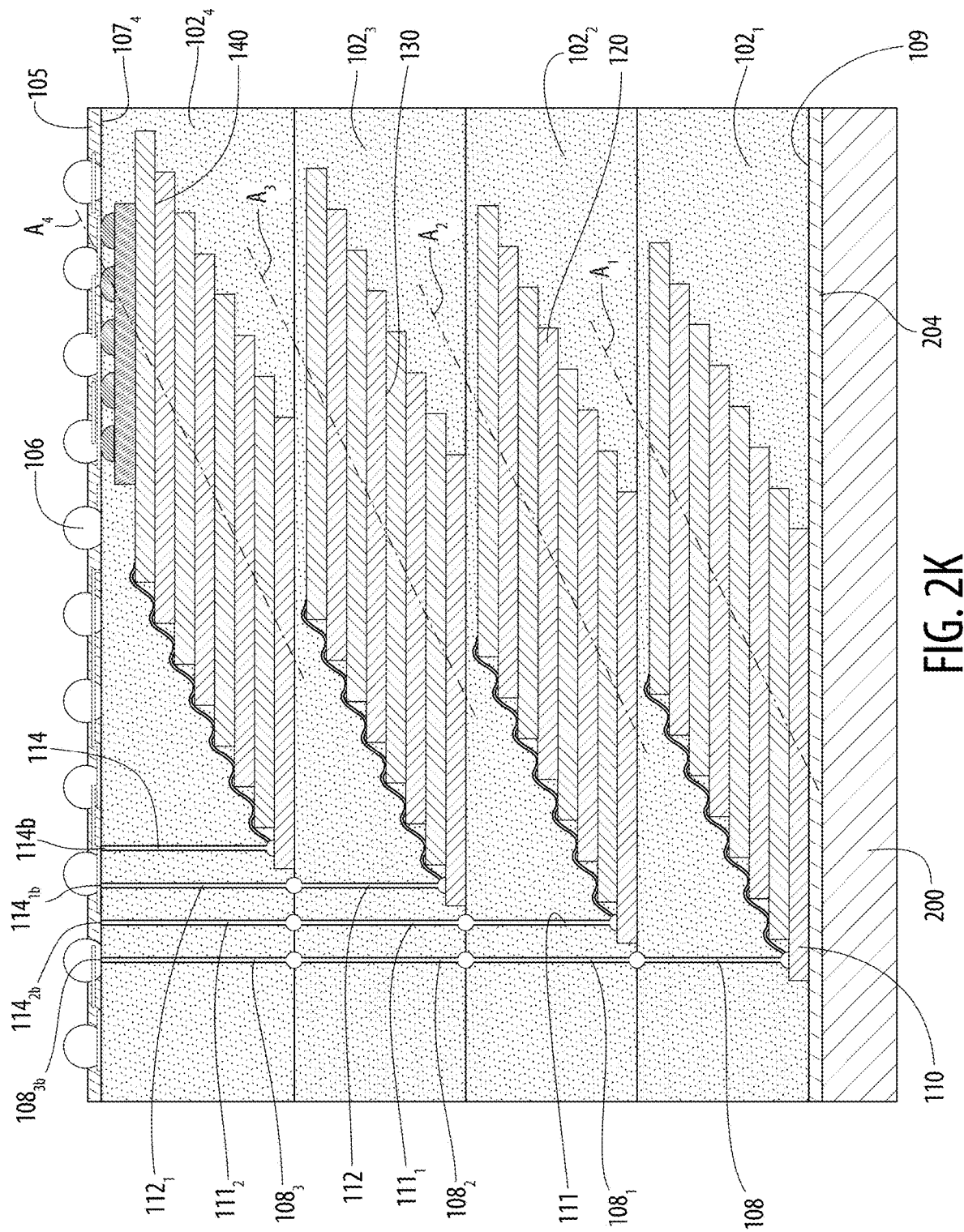

Referring to FIG. 2K, RDL 105 may be coupled to the top planar surface $107_4$ of fourth encapsulant $102_4$. In some embodiments, RDL 105 may be in electrical communication with vertical bond wires 108, 111, 112, and 114 and control die 150. For example, RDL 105 may be electrically connected to the second ends $108_{3b}$, $111_{2b}$, $112_{1b}$ of extensions $108_3$, $111_2$, and $112_1$ of the first, second and third vertical bond wires 108, 111, and 112 exposed at the top planar surface $107_4$ of the fourth encapsulant $102_4$. RDL 105 may be electrically connected to the second end 114b of the fourth vertical bond wire 114 and to the electrical connectors 152 of the control die 150 exposed at the top planar surface $107_4$ of the fourth encapsulant $102_4$. In some embodiments, a plurality of solder balls 106 may be coupled to RDL 105 such that RDL 105 is sandwiched between the top planar surface $107_4$ of the fourth encapsulant $102_4$ and the plurality of solder balls 102. In some embodiments, the plurality of solder balls 106 is electrically connected to RDL 105 such that. the plurality of solder balls 106 is in electrical communication with at least one of the first, second, third and/or fourth plurality of semiconductor dies 110, 120, 130, and 140 and control die 150. In some embodiments, the RDL 105 may electrically couple vertical bond wires 108, 111, 112, and 114 to the plurality of solder balls 106 such that the first, second, third and/or fourth plurality of semiconductor dies 110, 120, 130, and 140 are in electrical communication with the solder balls 106.

In some embodiments, the substrate 200 may be removed from the first plurality of semiconductor dies 110 and the bottom surface 109 of encapsulant 102$_1$. In some embodiments, film 204 may be used to decouple the substrate 200 from the first plurality of semiconductor dies 110 and the bottom surface 109 of the first encapsulant 102$_1$. For example, in one embodiment, film 204 is an ultraviolet release film having an adhesive coupling the release film to the substrate 200 and the first plurality of semiconductor device 110 and the bottom surface 109 of the first encapsulant 102$_1$. The ultraviolet release film may be subjected to ultraviolet light, causing the adhesive to not adhere to the first plurality of semiconductor device 110 and the bottom surface 109 of the first encapsulant 102$_1$, thereby allowing the substrate 200 to be removed. In other embodiments, film 204 is a thermal release film configured to cease adhering to the first plurality of semiconductor device 110 and the bottom surface 109 of the first encapsulant 102$_1$ and substrate 200 in response to a thermal stimulus (e.g., an amount of heat applied to the thermal release film). In some embodiments, there may be a layer of first encapsulant 102$_1$ between the first plurality of semiconductor dies 110 and film 204 such that when film 204 is removed, the bottom surface of the first plurality of semiconductor dies 110 is covered by said layer of the first encapsulant 102$_1$. In other embodiments, a protective cover may be coupled to the bottom surface of the first plurality of semiconductor dies 110 and/or the bottom surface 109 of encapsulant 102$_1$.

Figure 3A:
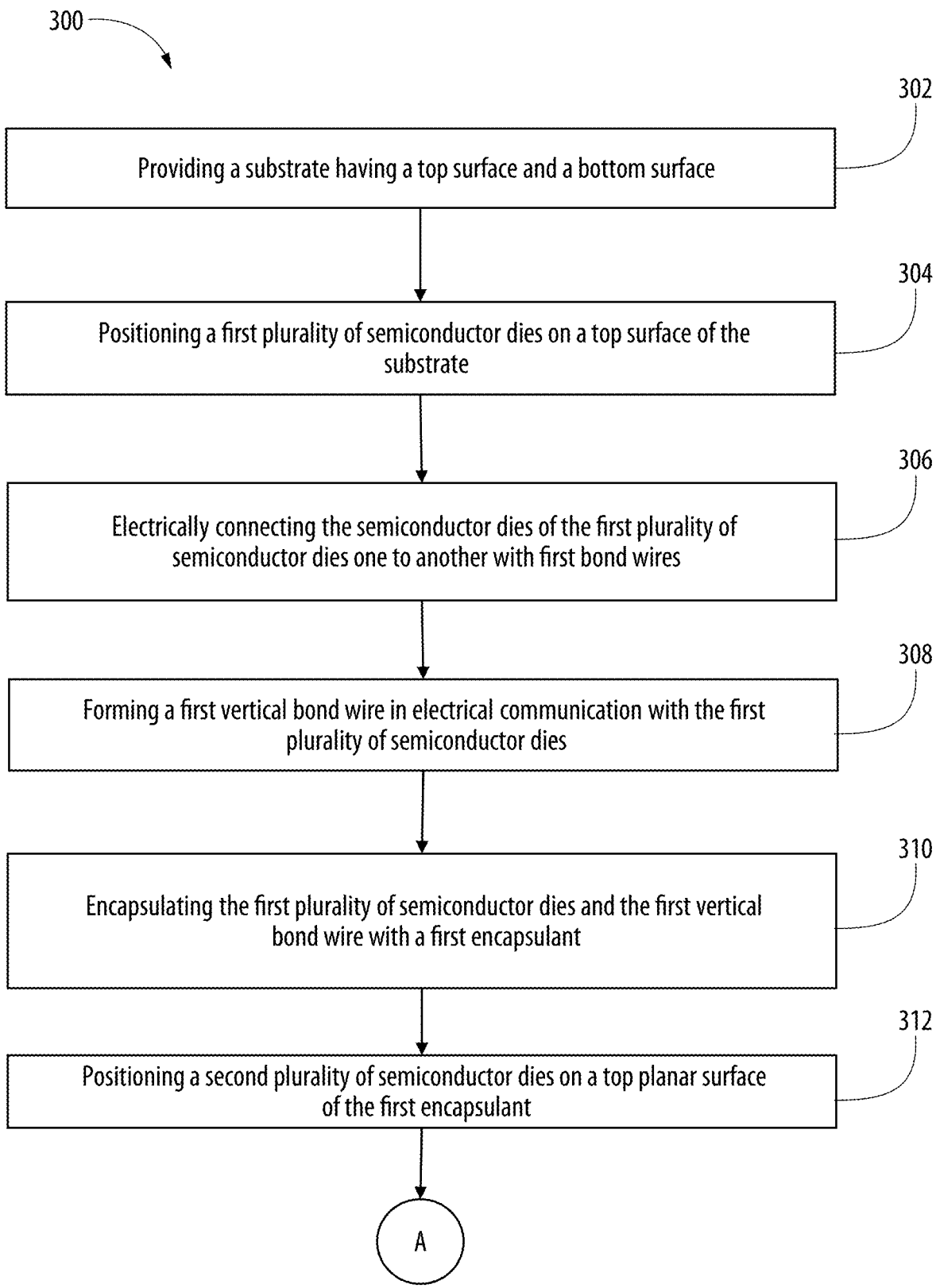
FIGS. 3A and 3B show an exemplary flowchart illustrating a method of assembling a semiconductor device package having two or more sets of stacked dies in accordance with an exemplary embodiment of the present disclosure.
Figure 3B:
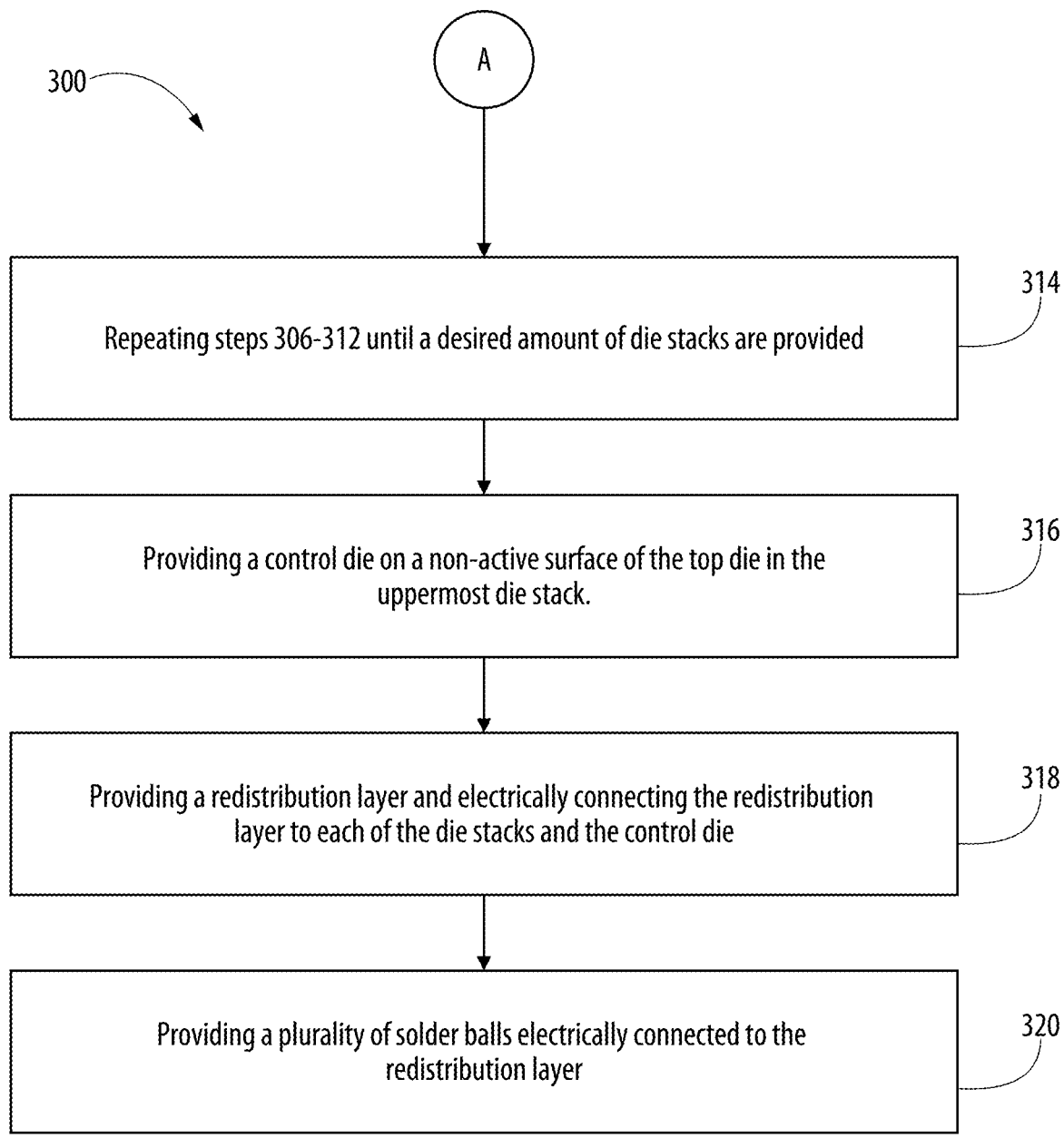

Referring to FIG. 3, there is shown a flow chart outlining steps of a method, generally designated 300, of stacking two or more pluralities of semiconductor dies, in accordance with an exemplary embodiment of the present disclosure. In some embodiments, the method 300 may include the step 302 of providing a substrate having a top surface and a bottom surface. For example, substrate 200, as shown in FIG. 2A, is provided. The substrate 200 includes a top surface 202 and a bottom surface 206. In some embodiments, the method 300 may include the step 304 of positioning a first plurality of semiconductor dies on the top surface of the substrate. In some embodiments, each semiconductor die of the first plurality of semiconductor dies are mounted one to another and positioned along a first axis to form a first die stack. For example, the first plurality of semiconductor dies 110, as shown in FIG. 2A, is positioned on the top surface 202 of substrate 200. Each semiconductor device of the first plurality of semiconductor dies 110 are coupled to one another and extend along first axis $A_1$. In some embodiments, the method 300 may include the step 306 of electrically connecting the semiconductor dies of the first plurality of semiconductor dies one to another with first die bond wires. For example, as shown in FIG. 2B, first die bond wire 104$_1$ is wire bonded to each semiconductor device of the first plurality of semiconductor dies 110.

In some embodiments, the method 300 may include the step 308 of providing a first vertical bond wire in electrical communication with the first plurality of semiconductor dies. In some embodiments the first vertical bond wire includes a first end coupled to the first plurality of semiconductor dies and a second end disposed opposite the first end. For example, as shown in FIG. 2B, a first end 108a of first vertical bond wire 108 is coupled to the first plurality of semiconductor dies 110, the second end 108b disposed opposite the first end 108a. In some embodiments, the method 300 may include the step 310 of encapsulating the first plurality of semiconductor dies and the first vertical bond wire with a first encapsulant. For example, as shown in FIG. 2C, the first plurality of semiconductor dies 110, first vertical bond wire 108, and first die bond wire 104$_1$ are partially encapsulated by a first encapsulant 102$_1$. In some embodiments, the first vertical bond wire 108 may be exposed at the top planar surface 107$_1$ of the first encapsulant. In some embodiments, the method 300 may include the step 312 of positioning a second plurality of semiconductor dies on a top planar surface of the first encapsulant. In some embodiments, each semiconductor die of the second plurality of semiconductor dies are mounted one to another and positioned along a second axis to form a second stack of dies. For example, as shown in FIG. 2D, the second plurality of semiconductor device 120 is positioned on the top planar surface 107$_1$ of the first encapsulant 102$_1$ above the first plurality of semiconductor dies 110. Each semiconductor die of the second plurality of semiconductor dies 120 is mounted one to another and is positioned along second axis $A_2$ to form the second stack of dies. In some embodiments, the second axis is generally parallel to and spaced from the first axis of the first plurality of semiconductor dies and the first axis and the second axis are at an oblique angle relative to an axis extending along a bottom surface of the first plurality of semiconductor dies. For example, as shown in FIGS. 1 and 2D, the second axis $A_2$ is generally parallel to and spaced from the first axis $A_1$ and both axes $A_1$ and $A_2$ are at an oblique angle relative to axis H which extends along the bottom surface 101 of the first plurality of semiconductor dies 110.

In some embodiments, the method 300 includes the step 314 of repeating steps 306 through 312 until a desired amount die stacks are provided. In some embodiments, steps 306 through 312 may be repeated one time, two times, three times, four times, or more than four times. In one embodiment, steps 306 through 312 may be repeated two times until four stacks of dies are provided. In some embodiments, the steps of electrically connecting the semiconductor dies of an existing plurality of semiconductor dies, forming a vertical bond wire electrically connected to said existing plurality of semiconductor dies, at least partially encapsulating said existing plurality of semiconductor dies in a corresponding encapsulant, and positioning a new plurality of semiconductor dies on the top planar surface of said corresponding encapsulant may be repeated until the desired amount of semiconductor die stacks (e.g., pluralities of semiconductor dies) are achieved. For example, step 314 may include the assembly process as shown in FIGS. 2E-2J until four pluralities of semiconductor dies, each encapsulated within a corresponding encapsulant and each including corresponding vertical bond wires and bond wires are provided. In some embodiments, step 314 of repeating steps 306 through 312 may include forming one or more extensions to a vertical bond wire previously formed. For example, as shown in FIGS. 2E-2J, extensions 108$_1$-108$_3$, 111$_1$-111$_2$, and 112$_1$ are formed on corresponding vertical bond wires 108, 111, and 112.

In some embodiments, the method 300 may include the step 316 of providing a control die on a non-active surface of the top die in the uppermost die stack. For example, as shown in FIG. 2J, control die 150 is positioned on a top surface 142 of the fourth plurality of semiconductor dies 140 (e.g., the uppermost die stack). The top surface 142 of the fourth plurality of semiconductor dies 140 may be a non-active surface that includes no exposed or available electrical connectors that the control die 150 would otherwise cover. In some embodiments, control die 150 is mounted via a flip-chip bonding method. In other embodiments, a vertical bond wire is electrically connected to control die 150. In some embodiments, the control die 150 is encapsulated within fourth encapsulant 102₄. In some embodiments, the method 300 may include the step 318 of providing a redistribution layer and electrically connecting the redistribution layer to each of the die stacks and the control die. For example, as shown in FIG. 2K, RDL 105 is positioned on the top planar surface 107₄ of the fourth encapsulant 102₄. RDL 105 is electrically connected to the second ends 108₃ᵦ, 111₂ᵦ, 112₁ᵦ of extensions 108₃, 111₂, and 112₁ of the first, second and third vertical bond wires 108, 111, and 112 exposed at the top planar surface 107₄ of the fourth encapsulant 102₄, such that RDL 105 is electrically connected to the first, second, and third pluralities of semiconductor dies 110, 120, and 130. Similarly, RDL 105 is electrically connected to the second end 114b of the fourth vertical bond wire 114 and to the electrical connectors 152 of the control die 150 exposed at the top planar surface 107₄ of the fourth encapsulant 102₄, such that RDL 105 is electrically connected to the fourth plurality of semiconductor dies 140 and control die 150. In some embodiments, the method 300 includes the step 320 of providing a plurality of solder balls electrically connected to the redistribution layer. For example, as shown in FIG. 2K, the plurality of solder balls 106 is electrically connected to redistribution layer 105 such that the plurality of solder balls 106 is in electrical communication with each plurality of semiconductor dies 110, 120, 130, and 140 and control die 150.

It will be appreciated by those skilled in the art that changes could be made to the exemplary embodiments shown and described above without departing from the broad inventive concepts thereof. It is understood, therefore, that this invention is not limited to the exemplary embodiments shown and described, but it is intended to cover modifications within the spirit and scope of the present invention as defined by the claims. For example, specific features of the exemplary embodiments may or may not be part of the claimed invention and various features of the disclosed embodiments may be combined. The words "right", "left", "lower" and "upper" designate directions in the drawings to which reference is made. Unless specifically set forth herein, the terms "a", "an" and "the" are not limited to one element but instead should be read as meaning "at least one".

It is to be understood that at least some of the figures and descriptions of the invention have been simplified to focus on elements that are relevant for a clear understanding of the invention, while eliminating, for purposes of clarity, other elements that those of ordinary skill in the art will appreciate may also comprise a portion of the invention. However, because such elements are well known in the art, and because they do not necessarily facilitate a better understanding of the invention, a description of such elements is not provided herein.

Further, to the extent that the methods of the present invention do not rely on the particular order of steps set forth herein, the particular order of the steps should not be construed as limitation on the claims. Any claims directed to the methods of the present invention should not be limited to the performance of their steps in the order written, and one skilled in the art can readily appreciate that the steps may be varied and still remain within the spirit and scope of the present invention.

What is claimed is:

1. A semiconductor device package comprising:
   a first die stack comprising a first plurality of semiconductor dies stacked one upon another, each die of the first plurality of semiconductor dies including a first edge and an opposing second edge;
   a first die bond wire electrically connected to and physically contacting each die of the first plurality of semiconductor dies;
   a first vertical bond wire connected to a first semiconductor die of the first plurality of semiconductor dies at the first edge of the first semiconductor die, the first vertical bond wire configured to electrically couple the first plurality of semiconductor dies to a control die; and
   a first encapsulant at least partially encapsulating the first plurality of semiconductor dies, the first die bond wire, and the first vertical bond wire, the first encapsulant having a top planar surface extending across an entire top surface of a topmost die of the first die stack;
   a second die stack comprising a second plurality of semiconductor dies, the second die stack having a bottommost surface directly contacting the top planar surface of the first encapsulant, each die of the second plurality of semiconductor dies stacked one upon another and including a first edge and an opposing second edge;
   a second die bond wire electrically connected to and physically contacting each die of the second plurality of semiconductor dies;
   a second vertical bond wire connected to a second semiconductor die of the second plurality of semiconductor dies at the first edge thereof, the second vertical bond wire configured to electrically couple the second plurality of semiconductor dies to the control die;
   a second encapsulant directly contacting the top planar surface of the first encapsulant and at least partially encapsulating the second plurality of semiconductor dies, the second die bond wire, and the second vertical bond wire; and
   a first extension to the first vertical bond wire directly connected to an end of the first vertical bond wire and vertically aligned with the first vertical bond wire, the first extension to the first vertical bond wire extending upwardly from the top planar surface of the first encapsulant and at least partially encapsulated by the second encapsulant,
   wherein the first edge of each die of the first plurality of semiconductor dies is laterally closer to the first vertical bond wire than the respective second edge, and a lateral distance between each of the first edges of the first plurality of semiconductor dies and the first vertical bond wire increases as a vertical stacking distance of each die of the first plurality of semiconductor dies increases from a bottom surface of the first die stack,
   wherein the first edge of each die of the second plurality of semiconductor dies is laterally closer to the first vertical bond wire and the second vertical bond wire than the respective second edge, and
   wherein the first edge of one semiconductor die of the second plurality of semiconductor dies is positioned between the first edges of two semiconductor dies of the first plurality of semiconductor dies.

2. The semiconductor device package of claim 1, wherein the first extension to the first vertical bond wire and the second vertical bond wire are positioned on a same side of the second die stack.

3. The semiconductor device package of claim 1 further comprising:
a redistribution layer configured to electrically couple the control die to the first and second pluralities of semiconductor dies, and
wherein the first vertical bond wire and the second vertical bond wire are electrically connected to the redistribution layer.

4. The semiconductor device package of claim 3, further comprising the control die,
wherein the control die is disposed between the redistribution layer and the second plurality of semiconductor dies.

5. The semiconductor device package of claim 1, wherein the first encapsulant covers an entire bottom surface of a bottommost die of the second die stack and the entire top surface of the topmost die of the first die stack such that the first and second die stacks are offset from one another in a vertical direction by a portion of the first encapsulant.

6. The semiconductor device package of claim 1, wherein the first plurality of semiconductor dies are positioned along a first axis and the second plurality of semiconductor dies are positioned along a second axis,
wherein the second axis is generally parallel to and spaced from the first axis,
wherein the first axis and the second axis each intersect with and are at an oblique angle relative to a vertical axis that is normal to the bottom surface of the first die stack,
wherein the first axis passes through a center of a bottommost die and the topmost die of the first die stack, and
wherein the second axis passes through a center of a bottommost die and a topmost die of the second die stack.

7. The semiconductor device package of claim 1, wherein the first encapsulant and the second encapsulant are comprised of a same material.

8. A semiconductor device package comprising:
a control die;
a first die stack comprising a first plurality of semiconductor dies stacked one upon another, each die of the first plurality of semiconductor dies including a first edge and an opposing second edge;
a first die bond wire electrically connected to and physically contacting each die of the first plurality of semiconductor dies;
a first vertical bond wire connected to a first semiconductor die of the first plurality of semiconductor dies at the first edge of the first semiconductor die, the first vertical bond wire configured to electrically couple the first plurality of semiconductor dies to the control die; and
a first encapsulant at least partially encapsulating the first plurality of semiconductor dies, the first die bond wire, and the first vertical bond wire, the first encapsulant having a top planar surface extending across an entire top surface of a topmost die of the first die stack;
a second die stack comprising a second plurality of semiconductor dies, the second die stack having a bottommost surface directly contacting the top planar surface of the first encapsulant, each die of the second plurality of semiconductor dies stacked one upon another and including a first edge and an opposing second edge;
a second die bond wire electrically connected to and physically contacting each die of the second plurality of semiconductor dies;
a second vertical bond wire connected to a second semiconductor die of the second plurality of semiconductor dies at the first edge thereof, the second vertical bond wire configured to electrically couple the second plurality of semiconductor dies to the control die;
a first extension to the first vertical bond wire directly connected to an end of the first vertical bond wire and extending upwardly from the top planar surface of the first encapsulant, the first extension to the first vertical bond wire being vertically aligned with the first vertical bond wire;
a second encapsulant directly contacting the top planar surface of the first encapsulant and at least partially encapsulating the second plurality of semiconductor dies, the second die bond wire, and the second vertical bond wire; and
a redistribution layer configured to electrically couple the control die to the first and second pluralities of semiconductor dies,
wherein the control die, the first vertical bond wire and the second vertical bond wire are electrically connected to the redistribution layer,
wherein the first extension to the first vertical bond wire and the second vertical bond wire are positioned on a same side of the second die stack, and
wherein the first edge of each die of the first plurality of semiconductor dies is laterally closer to the first vertical bond wire than the respective second edge, and a lateral distance between each of the first edges of the first plurality of semiconductor dies and the first vertical bond wire increases as a vertical stacking distance of each die of the first plurality of semiconductor dies increases from a bottom surface of the first die stack,
wherein the first edge of each die of the second plurality of semiconductor dies is laterally closer to the first vertical bond wire and the second vertical bond wire than the respective second edge, and
wherein the first edge of one semiconductor die of the second plurality of semiconductor dies is positioned between the first edges of two semiconductor dies of the first plurality of semiconductor dies.

9. The semiconductor device package of claim 8, wherein the first vertical bond wire and the first extension to the first vertical bond wire are substantially parallel to the second vertical bond wire.

10. The semiconductor device package of claim 8, wherein the control die is a flip-chip die or a wire-bond die.

11. The semiconductor device package of claim 8, wherein the control die is disposed between the redistribution layer and the second plurality of semiconductor dies.

12. The semiconductor device package of claim 8, wherein the first encapsulant covers an entire bottom surface of a bottommost die of the second die stack and the entire top surface of the topmost die of the first die stack such that the first and second die stacks are separated from one another by a portion of the first encapsulant.

13. The semiconductor device package of claim 8, wherein the first plurality of semiconductor dies are positioned along a first axis and the second plurality of semiconductor dies are positioned along a second axis,
wherein the second axis is generally parallel to and spaced from the first axis,
wherein the first axis and the second axis each intersect with and are at an oblique angle relative to a vertical axis that is normal to the bottom surface of the first die stack, wherein the first axis passes through a center of a bottommost die and the topmost die of the first die stack, and wherein the second axis passes through a center of a bottommost die and a topmost die of the second die stack.

\* \* \* \* \*